(12) United States Patent
Morise et al.

(10) Patent No.: US 9,153,340 B2
(45) Date of Patent: Oct. 6, 2015

(54) MAGNETIC STORAGE ELEMENT, MAGNETIC STORAGE DEVICE, MAGNETIC MEMORY, AND DRIVING METHOD

(71) Applicant: Kabushiki Kaisha Toshiba, Minato-ku (JP)

(72) Inventors: Hirofumi Morise, Yokohama (JP); Yoshiaki Fukuzumi, Yokohama (JP); Tsuyoshi Kondo, Kawasaki (JP); Shiho Nakamura, Fujisawa (JP); Hideaki Aochi, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 54 days.

(21) Appl. No.: 14/081,149

(22) Filed: Nov. 15, 2013

(65) Prior Publication Data

US 2014/0140126 A1 May 22, 2014

(30) Foreign Application Priority Data

Nov. 20, 2012 (JP) ................................. 2012-254414

(51) Int. Cl.
| | |
|---|---|
| *G11C 11/00* | (2006.01) |
| *G11C 19/02* | (2006.01) |
| *G11C 19/08* | (2006.01) |
| *H01L 27/22* | (2006.01) |
| *H01L 43/08* | (2006.01) |

(52) U.S. Cl.
CPC ................. *G11C 19/02* (2013.01); *G11C 19/08* (2013.01); *H01L 27/22* (2013.01); *H01L 43/08* (2013.01)

(58) Field of Classification Search
USPC .......... 365/158, 171, 173, 80, 225.5, 88, 130, 365/51
See application file for complete search history.

(56) References Cited

U.S. PATENT DOCUMENTS

| 7,626,844 B1 | 12/2009 | Moriya et al. | |
| 2008/0278998 A1* | 11/2008 | Cowburn et al. | ............. 365/171 |

* cited by examiner

*Primary Examiner* — Thong Q Le
(74) *Attorney, Agent, or Firm* — Oblon, McClelland, Maier & Neustadt, L.L.P.

(57) ABSTRACT

A magnetic storage element includes a magnetic nanowire. A cross-section of the magnetic nanowire has first and second visible outlines, the first visible outline has a first minimal point at which a distance from a virtual straight line becomes minimal, a second minimal point at which the distance from the virtual straight line becomes minimal, and a first maximal point at which the distance from the virtual straight line becomes longest between the first minimal point and the second minimal point, and an angle between a first straight line connecting the first minimal point and the second minimal point, and one of a second straight line connecting the first minimal point and the first maximal point and a third straight line connecting the second minimal point and the first maximal point is not smaller than four degrees and not larger than 30 degrees.

23 Claims, 30 Drawing Sheets

| | Lp [nm] | W [nm] | Lh [nm] | Lv [nm] | θ [°] | t [nm] | Ms [emu/cm³] | Ku [erg/cm³] |
|---|---|---|---|---|---|---|---|---|
| EXAMPLE 5 | 54 | 20 | 2 | 2 | 13.5 | 25 | 300 | 8×10⁶ |
| EXAMPLE 6 | 38 | 40 | 0 | 20 | 24.0 | 20 | 600 | 7×10⁶ |
| EXAMPLE 7 | 60 | 100 | 20 | 0 | 11.3 | 4 | 600 | 5×10⁶ |
| EXAMPLE 8 | 48 | 60 | 10 | 6 | 7.1 | 15 | 200 | 2×10⁶ |
| COMPARATIVE EXAMPLE 5 | 36 | 86 | 0 | 0 | 45.0 | 5 | 500 | 5×10⁶ |
| COMPARATIVE EXAMPLE 6 | 90 | 80 | 30 | 0 | 33.7 | 10 | 600 | 8×10⁶ |
| COMPARATIVE EXAMPLE 7 | 36 | 44 | 0 | 8 | 35.5 | 12 | 500 | 4×10⁶ |

(a) COMPARATIVE EXAMPLE 5
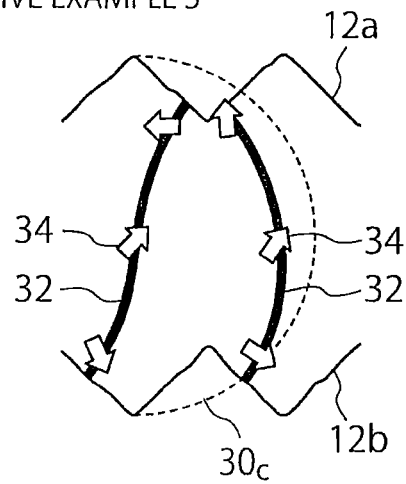
(b) COMPARATIVE EXAMPLE 6
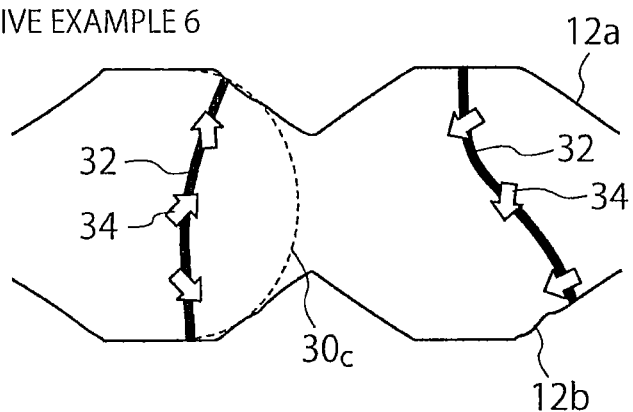
(c) COMPARATIVE EXAMPLE 7
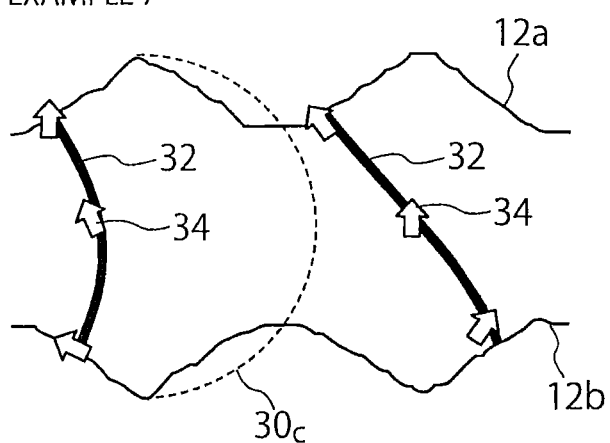
FIG. 31

United States Patent US 9,153,340 B2

MAGNETIC STORAGE ELEMENT, MAGNETIC STORAGE DEVICE, MAGNETIC MEMORY, AND DRIVING METHOD

CROSS-REFERENCE TO RELATED APPLICATIONS

This application is based upon and claims the benefit of priority from prior Japanese Patent Application No. 2012-254414 filed on Nov. 20, 2012 in Japan, the entire contents of which are incorporated herein by reference.

FIELD

Embodiments described herein relate generally to magnetic storage elements, magnetic storage devices, magnetic memories, and driving methods.

BACKGROUND

Conventionally, a semiconductor memory is designed so that each of the memory cells includes a storage element, a select element, and an information extracting line.

In recent years, shift-register memories have been suggested so as to realize larger memory capacities. This suggestion is based on the concept that only storage elements are arranged at high density, and the system is designed for transferring stored information to the location of a sensor formed in a predetermined site or an interconnect. Accordingly, there is a possibility that the memory capacities can be dramatically increased. In view of the purposes of development of the shift-register memories, placing a control electrode in each bit (each digit) is not desirable, and a shift operation for a desired digit number needs to be performed by adding some function to the entire bit string.

However, accurate shifting of information in all digits is not easy.

BRIEF DESCRIPTION OF THE DRAWINGS

FIGS. 31($a$) through 31($c$) are diagrams showing the shapes of magnetic nanowires of Comparative Examples 5 through 7.

DETAILED DESCRIPTION

A magnetic storage element according to an embodiment includes: a magnetic nanowire including a magnetic domain; a pair of electrodes configured to apply current to the magnetic nanowire, the pair of electrodes being connected to the magnetic nanowire; a writing unit configured to write magnetization information into the magnetic domain, the writing unit being connected to the magnetic nanowire; and a reading unit configured to read the magnetization information from the magnetic domain, the reading unit being connected to the magnetic nanowire. The magnetic nanowire has a magnetization direction perpendicular to a first direction in which the magnetic nanowire extends, a cross-section of the magnetic nanowire taken along a plane determined by the first direction and a second direction perpendicular to the first direction has first and second visible outlines, the first visible outline has a first minimal point at which a distance from a virtual straight line parallel to the first direction becomes minimal, a second minimal point at which the distance from the virtual straight line becomes minimal, and a first maximal point at which the distance from the virtual straight line becomes longest between the first minimal point and the second minimal point, the second minimal point being different from the first minimal point, the virtual straight line being located inside the magnetic nanowire, and an angle between a first straight line connecting the first minimal point and the second minimal point, and one of a second straight line connecting the first minimal point and the first maximal point and a third straight line connecting the second minimal point and the first maximal point is not smaller than four degrees and not larger than 30 degrees.

The following is a detailed description of embodiments, with reference to the accompanying drawings.

(First Embodiment)

Figure 1:
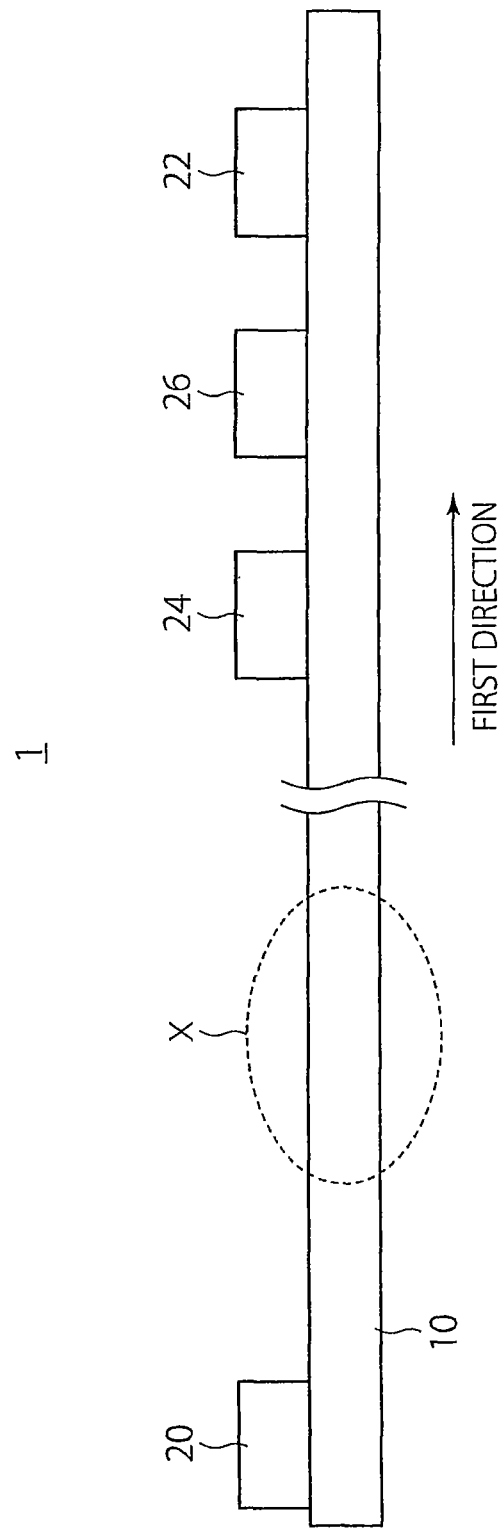
FIG. 1 is a cross-sectional view of a magnetic storage element according to a first embodiment of the present invention.

FIG. 1 shows a magnetic storage element according to a first embodiment. The magnetic storage element 1 of the first embodiment includes a magnetic nanowire 10, electrodes 20 and 22, a reading unit 24, and a writing unit 26.

In this specification, the magnetic nanowire 10 is a magnetic film in which the size (the length) in the extending direction (a first direction) is 10 or more times larger than the size (the width) in a second direction perpendicular to the first direction and the size (the thickness) in a third direction perpendicular to the first and second directions. FIG. 1 is a cross-sectional view of the magnetic storage element 1 of the first embodiment, taken along a line parallel to the first direction of the magnetic nanowire 10. The cross-sectional shape of the magnetic nanowire 10 taken along a plane perpendicular to the first direction is a rectangle, for example. The size (the width and the thickness) of the cross-section is preferably not smaller than 2 nm and not larger than 100 nm, so as to prevent distribution in the magnetization direction.

Figure 2:
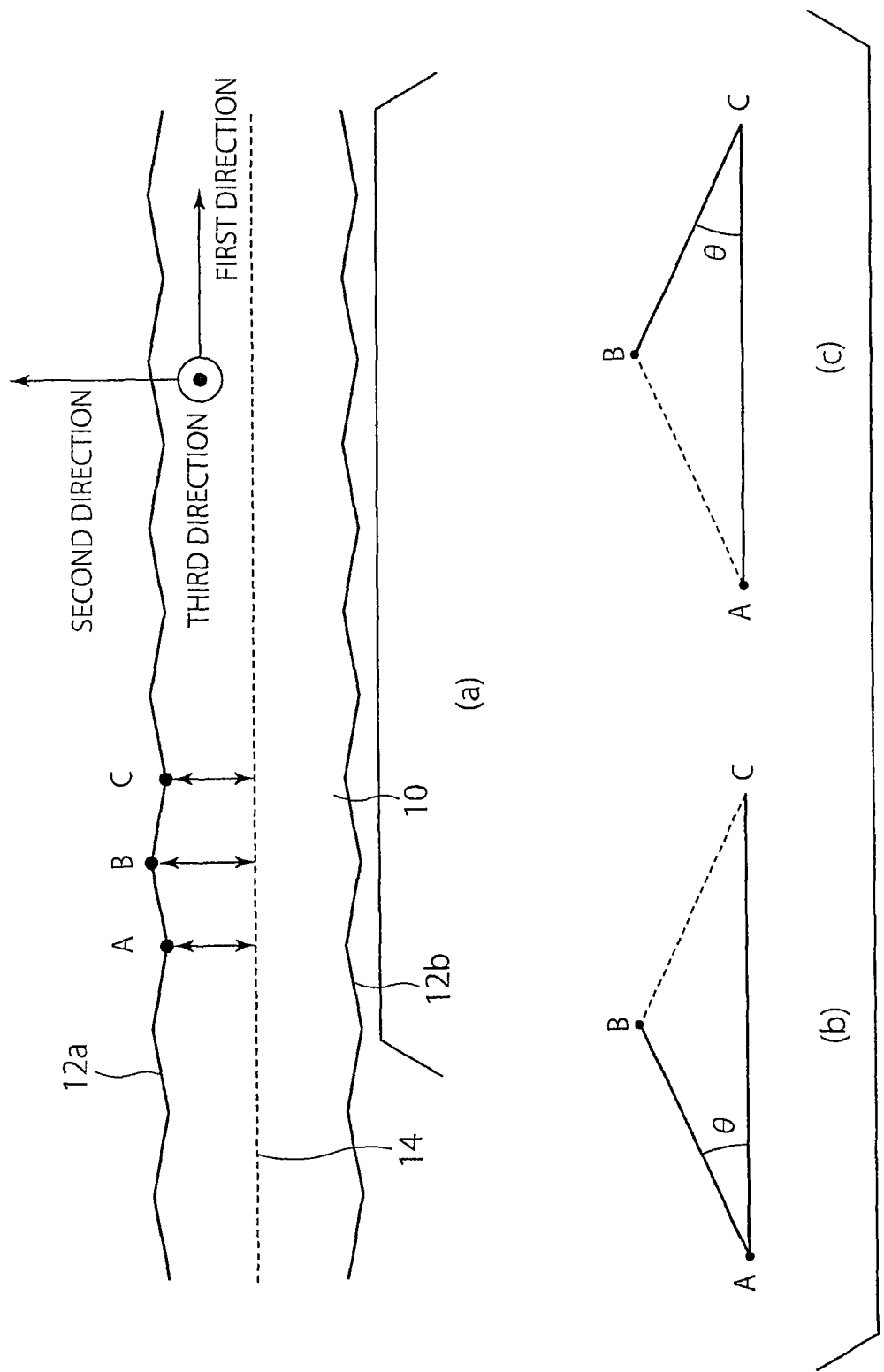
FIGS. 2($a$) through 2($c$) are diagrams for explaining the shape of the magnetic nanowire.

Referring now to FIGS. 2(a) through 3(c), the shape of the magnetic nanowire 10 is described. FIG. 2(a) shows a cross-section of a portion X (see FIG. 1) or a cross-section in the width direction of the magnetic nanowire 10 taken along a plane perpendicular to the third direction. As can be seen from FIG. 2(a), the lines indicating the width of the magnetic nanowire 10, or visible outlines 12a and 12b, vary in the first direction (the extending direction). To specifically describe the shapes of those visible outlines 12a and 12b, a straight line 14 that is parallel to the first direction is virtually set in the magnetic nanowire 10. The visible outline located on one side (the upper side in the drawing) of the straight line 14 is the visible outline 12a, and the visible outline located on the other side (the lower side in the drawing) is the visible outline 12b.

Minimal points A and C in relation to the distance from the straight line 14 to the visible outline 12a are minimal points that are located on the visible outline 12a and are adjacent to each other. The point at which the distance to the straight line 14 becomes longest on the visible outline 12a between the minimal points A and C is selected as a maximal point B. Accordingly, the visible outline 12a has a shape having an angle θ of not smaller than four degrees and not larger than 30 degrees as the angle BAC or BCA, as shown in FIG. 2(b) or 2(c). The points A, B, and C serve as reference points for determining the shape of the visible outline 12a.

As shown in FIG. 3(a), minimal points A' and C' in relation to the distance from the straight line 14 to the visible outline 12b are minimal points that are located on the visible outline 12b and are adjacent to each other. The point at which the distance to the straight line 14 becomes longest on the visible outline 12b between the minimal points A' and C', is selected as a maximal point B'. Accordingly, the visible outline 12b has a shape having an angle θ of not smaller than four degrees and not larger than 30 degrees as the angle B'A'C' or B'C'A', as shown in FIG. 3(b) or 3(c). The points A', B', and C' serve as reference points for determining the shape of the visible outline 12b.

The magnetic nanowire 10 has magnetic domains in accordance with bit data stored in the magnetic storage element 1. The easy axis of magnetization of the magnetic nanowire 10 extends in a direction perpendicular to the first direction, or extends in the second direction or the third direction, for example. In each magnetic domain, the direction in which magnetization is stabilized is either the positive direction or the negative direction of the easy axis of magnetization. In the vicinity of the boundary between two adjacent magnetic domains, the magnetization direction continuously varies in the first direction. This region in which the magnetization direction varies is called a domain wall. A domain wall has a finite length (a length in the first direction) $L_{dw}$ that is determined by anisotropy energy Ku and exchange stiffness A of the magnetic material. The domain wall length $L_{dw}$ (also called the domain wall width) is theoretically defined as $L_{dw}=2(A/Ku)^{1/2}$. For example, where A is 1 μerg/cm, and Ku is $10^7$ erg/cm$^3$, $L_{dw}$ is 6 nm.

In the magnetic storage element 1 of the first embodiment, bit data is stored as the magnetization direction in the magnetic nanowire in the first direction. The length $L_b$ of one bit in the first direction (hereinafter referred to as the bit length) is typically 6 to 200 nm. This bit length $L_b$ is preferably two or more times longer than the domain wall length $L_{dw}$. Further, where the bit length $L_b$ is not shorter than 15 nm and not longer than 100 nm, thermal instability in the magnetic domains between adjacent domain walls due to interactions between the adjacent domain walls can be desirably reduced. If a domain wall is located in a position where the width of the magnetic nanowire 10 becomes minimal, the domain wall is pinned in the position where the width of the magnetic nanowire 10 becomes minimal, and unintended domain wall shift can be prevented when current is not applied. For example, 1-bit data can be stored in a region from a position $x_1$ where the width of the magnetic nanowire 10 becomes minimal to another position $x_2$ where the width of the magnetic nanowire 10 becomes minimal, the minimal position $x_2$ being adjacent to the minimal position $x_1$. In this case, the distance from $x_1$ to $x_2$ is represented by $L_p$. More than one minimal point of the width of the magnetic nanowire 10 may exist in a region of 1-bit length.

Figure 3:
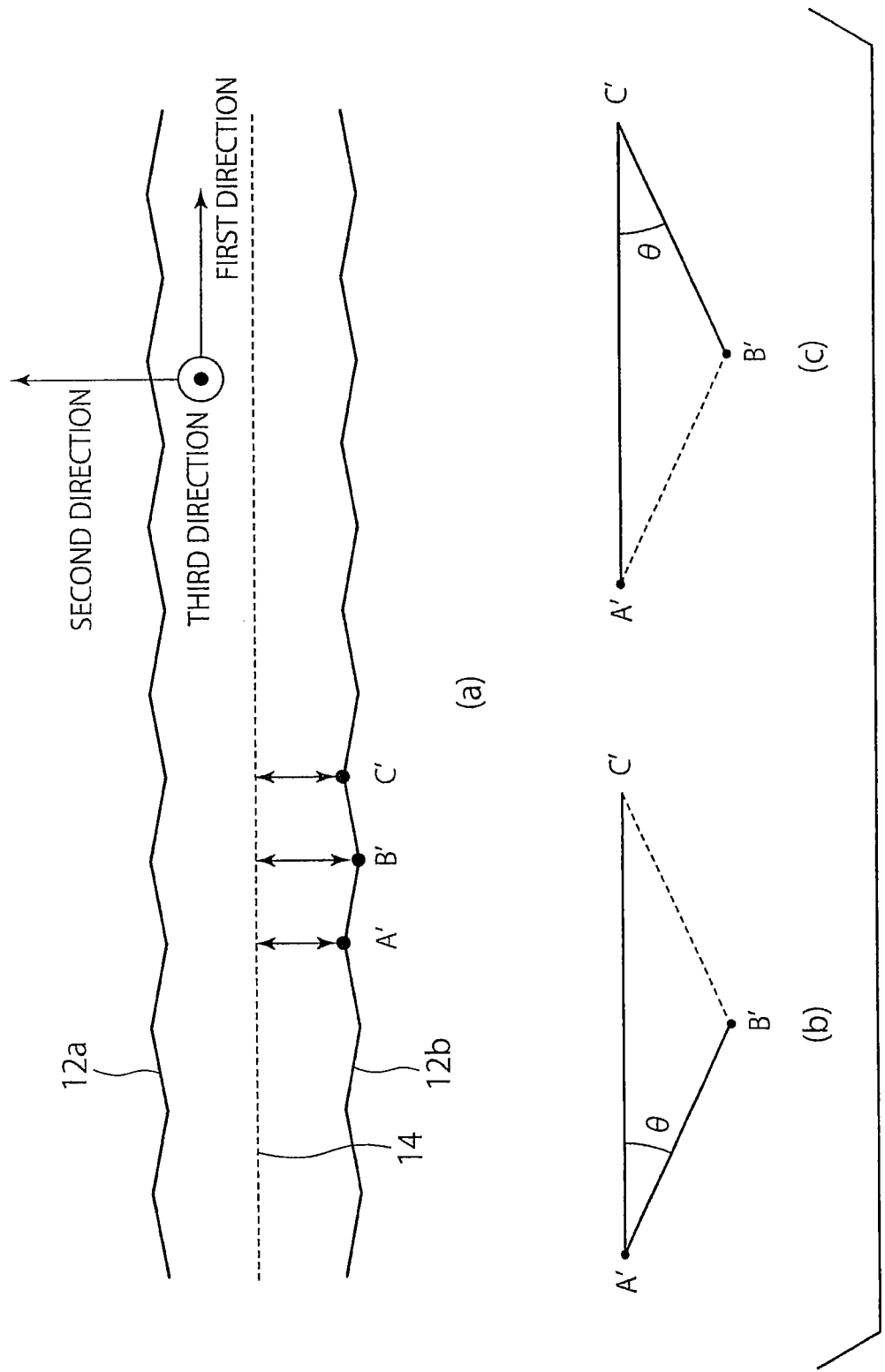
FIGS. 3($a$) through 3($c$) are diagrams for explaining the shape of the magnetic nanowire.

In FIGS. 1 through 3(a) and the drawings after FIG. 3(a), changes equivalent to only several bits are shown as changes in the width of the magnetic nanowire. However, to store data of a hundred to several thousands of bits, the width of the magnetic nanowire 10 varies over an even longer region in practice. As the total length of the magnetic nanowire 10 is made longer, data of a larger number of bits can be stored. However, if the total length of the magnetic nanowire 10 becomes extremely long, the electrical resistance of the entire magnetic nanowire 10 becomes higher. Therefore, the typical total length of the magnetic nanowire 10 preferably falls within the range of 100 nm to 10 μm.

Figure 4:
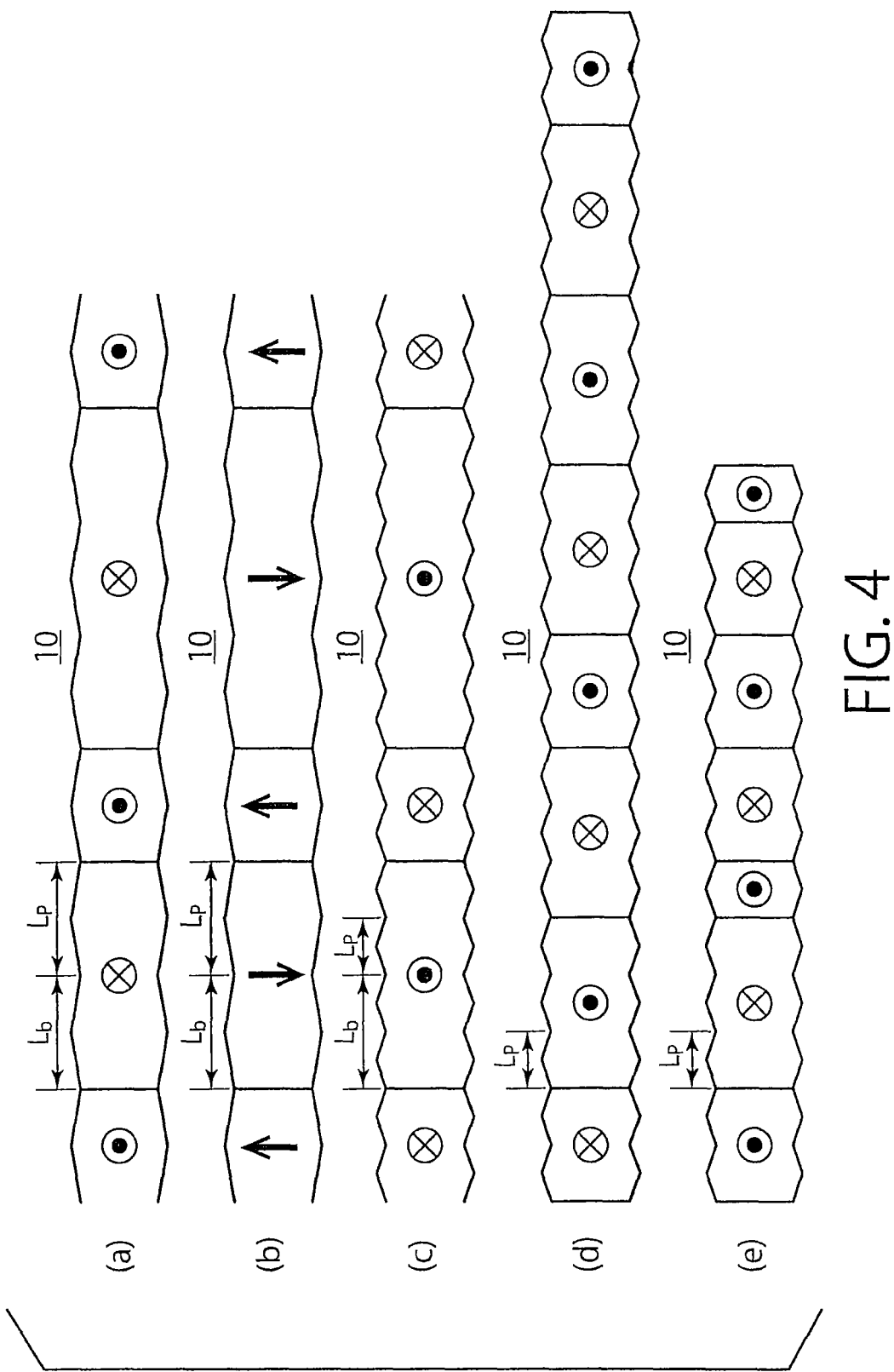
FIGS. 4($a$) through 4($e$) are diagrams for explaining the shape of the magnetic nanowire.

FIGS. 4(a) through 4(c) show examples of storing of 8-bit data of "01101110". As shown in FIG. 4(a), the data can be stored as the magnetization direction of the magnetic domains in the magnetic nanowire 10 having its easy axis of magnetization in the third direction. As shown in FIG. 4(b), the easy axis of magnetization may extend in the second direction. Although the minimum value of $L_b$ is equal to $L_p$ in the examples illustrated in FIGS. 4(a) and 4(b), $L_b$ may be larger than $L_p$ as shown in FIG. 4(c). In this case, the positions where the width of the magnetic nanowire 10 becomes minimal are included in the 1-bit magnetic domains (not including the boundaries).

Also, the bit length of one bit does not need to be the same as the bit length of another bit. In the example illustrated in FIG. 4(d), bits with $L_b=2L_p$ coexist with bits with $L_b=3L_p$, for example. Where data is stored so that $L_b$ becomes equal to or larger than $2L_p$ as shown in the example illustrated in FIG. 4(d), the total length can be made shorter while the distance between each two adjacent domain walls is prevented from becomes shorter. Accordingly, such an arrangement is desirable, as a higher density can be easily achieved. Also, in a case where $L_b \geq 2L_p$ is established only at the bits stored as magnetic domains having a specific magnetization direction with respect to the easy axis of magnetization at least at one portion of the magnetic nanowire 10 as shown in FIG. 4(e), a higher density is easily achieved. In view of this, such an arrangement is also desirable.

Figure 5:
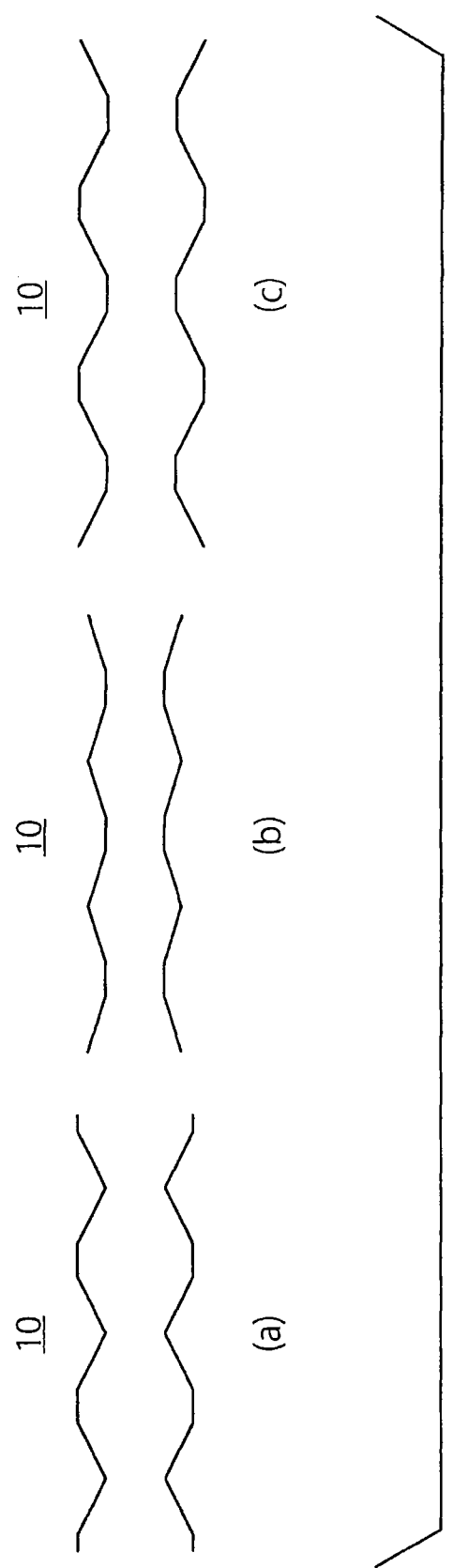
FIGS. 5($a$) through 5($c$) are diagrams for explaining the shape of the magnetic nanowire.

As shown in FIGS. 5(a) through 5(c), the shape of the magnetic nanowire 10 may include (flat) regions where the nanowire width is almost constant in the vicinities of the maximal points and/or the minimal points with respect to the width of the magnetic nanowire 10. Hereinafter, the regions where the nanowire width is almost constant in the vicinities of the maximal points or the minimal points will be referred to as maximal regions or minimal regions.

Figure 6:
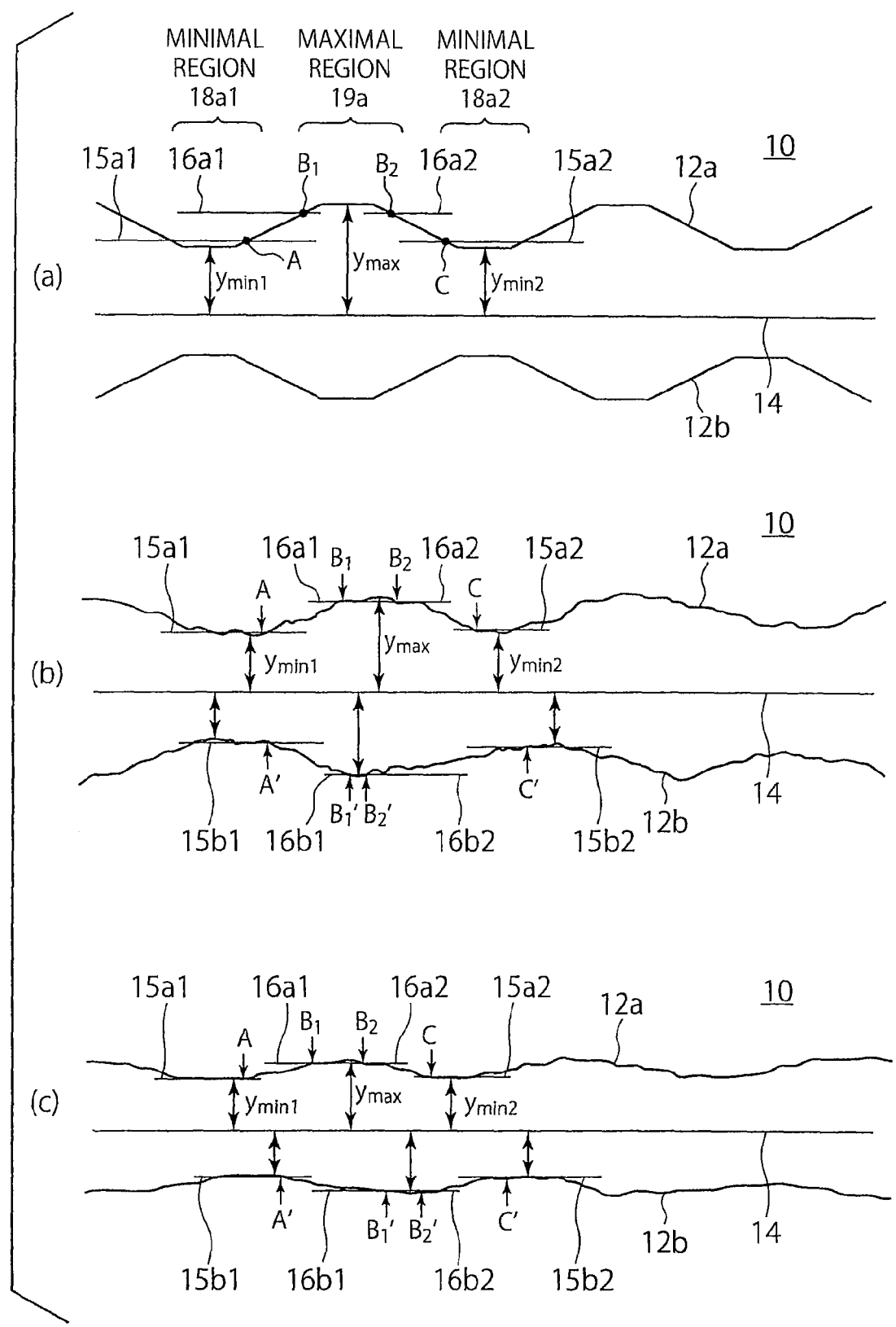
FIGS. 6($a$) through 6($c$) are diagrams for explaining settings of reference points on the visible outlines of the magnetic nanowire.
Figure 7:
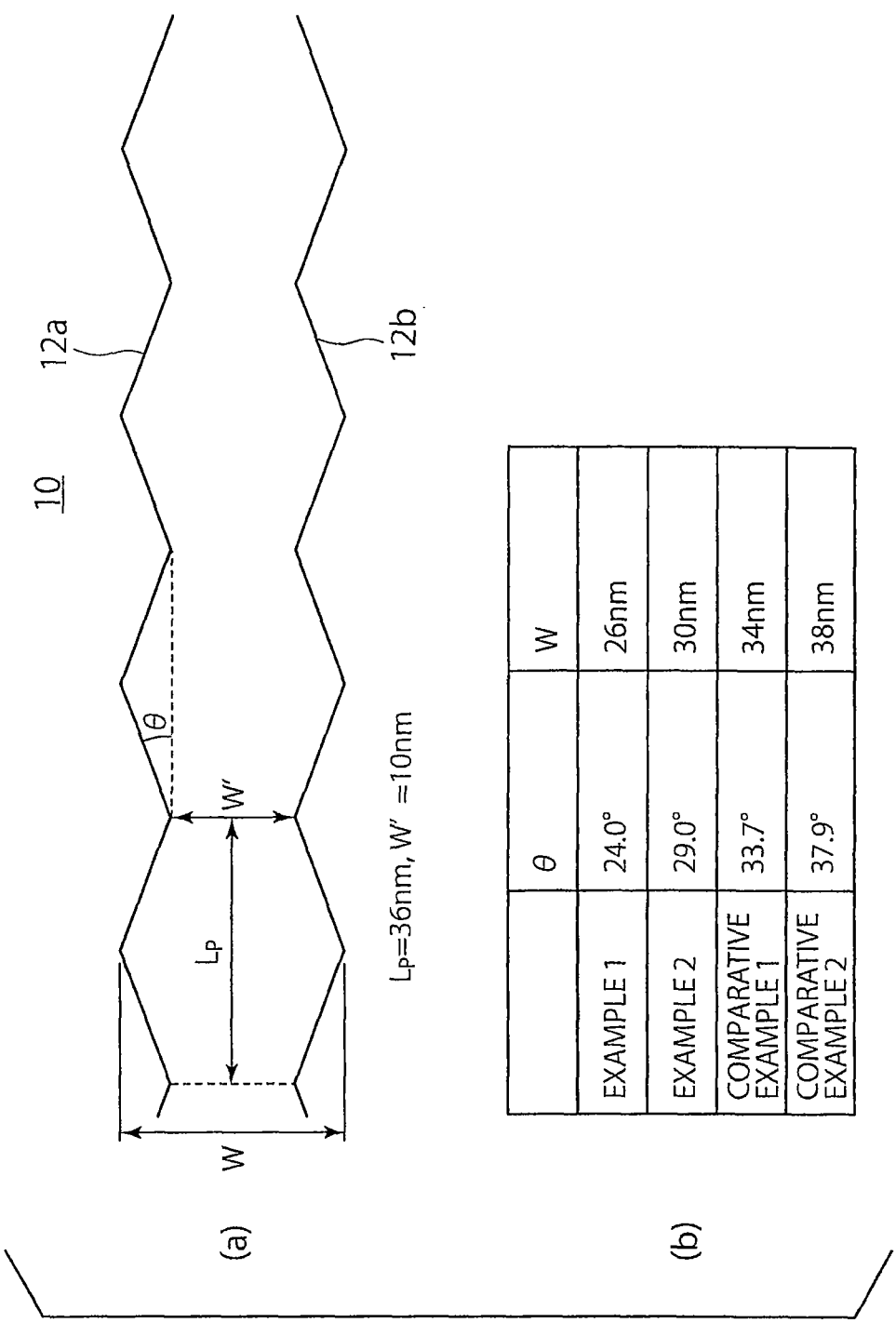
FIGS. 7($a$) and 7($b$) are diagrams for explaining the conditions for simulations.
Figure 8:
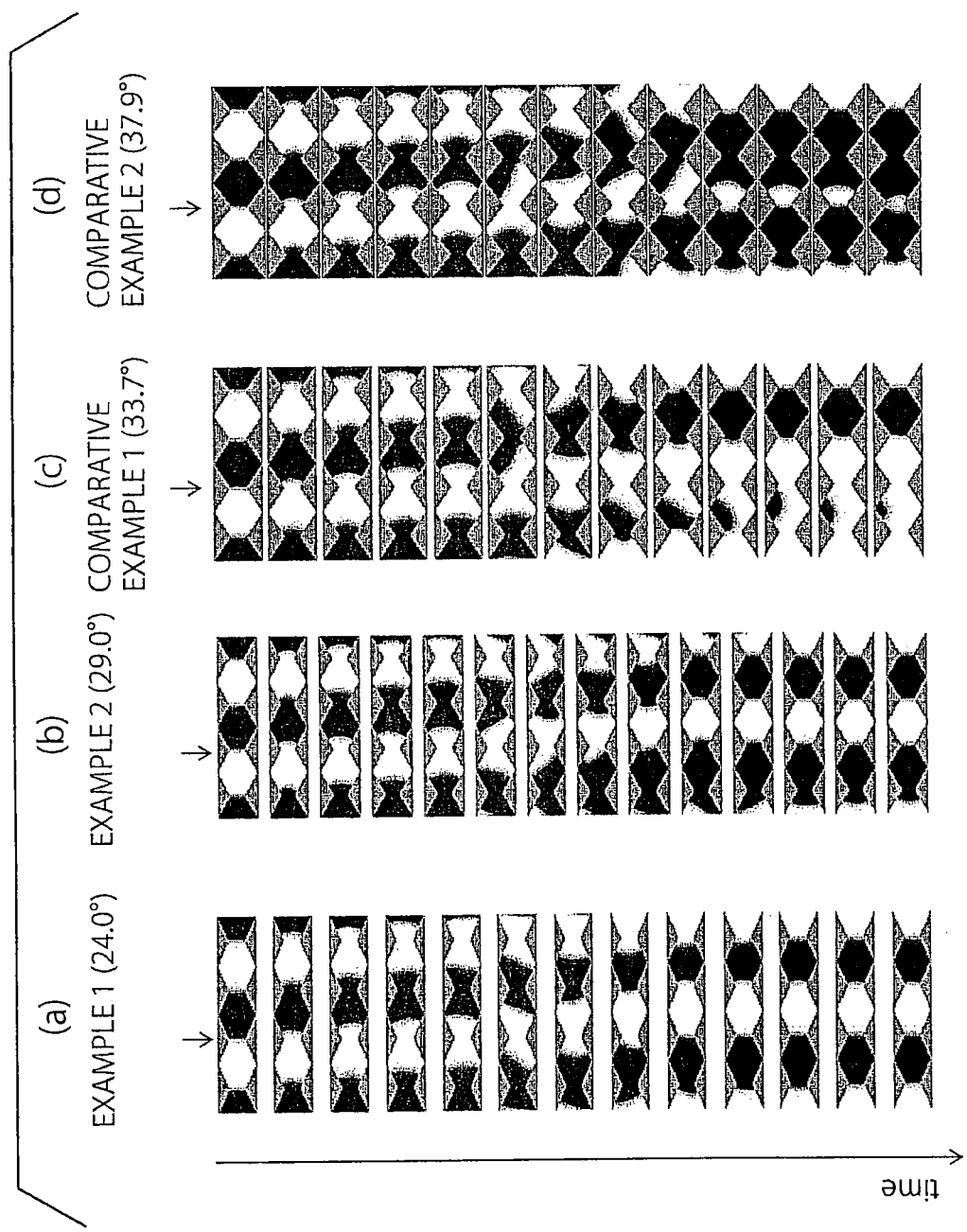
FIGS. 8($a$) through 8($d$) are diagrams showing the results of the simulations.

Referring now to FIGS. 6(a) through 6(c), settings of points A, B, and C on a visible outline in a case where maximal regions or minimal regions exist are described. As shown in FIG. 6(a), in the region including two minimal regions 18a1 and 18a2 and a maximal region 19a interposed between the minimal regions 18a1 and 18a2, the minimal value, the maximal value, and the minimal value of the distance from the visible outline 12a to the straight line 14 are represented by $y_{min1}$, $y_{max}$, and $y_{min2}$, respectively. At this point, among the intersection points between the visible outline 12a and a straight line 15a1 at a distance of $0.9y_{min1}+0.1y_{max}$ from the straight line 14, the point closest to the maximal region 19a is set as A. Among the intersection points between the visible outline 12a and a straight line 15a2 at a distance of $0.9y_{min2}+0.1y_{max}$ from the straight line 14, the point closest to the maximal region 19a is set as C. Also, among the intersection points between the visible outline 12a and a straight line 16a1 at a distance of $0.1y_{min1}+0.9y_{max}$ from the straight line 14, the point closest to the point A is set as $B_1$. Among the intersection points between the visible outline 12a and a straight line 16a2 at a distance of $0.1y_{min2}+0.9y_{max}$ from the straight line 14, the point closest to the point C is set as $B_2$. In this case, the magnetic nanowire 10 has such a shape that at least one of the angles $B_1AC$ and $B_2CA$ is in the range of 4 to 30 degrees.

As shown in FIG. 6(b), points A', $B_1$', $B_2$', and C' with respect to the visible outline 12b are set in the same manner as above. As shown in FIG. 6(c), the points A and A', the points $B_1$ and $B_1$', the points $B_2$ and $B_2$', and the points C and C do not have to exist in the same positions as each other in the first direction. Also, as shown in FIGS. 6(b) and 6(c), a minimal point and a maximal point may further exist between the minimal point A and the maximal point $B_1$ and between the minimal point C and the maximal point $B_2$ on the visible outline 12a. The same applies to the visible outline 12b.

Figure 26:
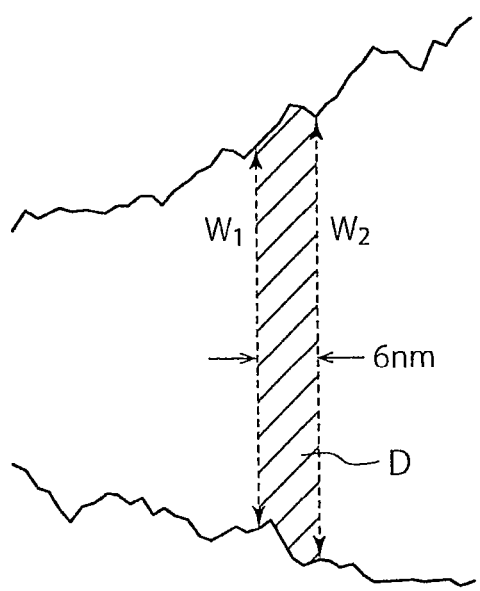
FIG. 26 is a diagram for explaining a nanowire width change rate.

As described above, the visible outlines of the magnetic nanowire 10 each have an angle that is not smaller than four degrees and not greater than 30 degrees as the mean value obtained by connecting end points between minimal regions and maximal regions. However, the visible outlines may locally fall outside the range. Specifically, as the length $L_{dw}$ of a domain wall is typically 6 nm, an unintended domain wall pinning site is not formed even if the nanowire width of the magnetic nanowire 10 varies in a region of 6 nm in length in the first direction between a minimal region and a maximal region. With such a variation in shape, the cause of an unintended domain wall pinning site in a certain position can be reduced, and accordingly, collective domain wall displacement becomes easier. In view of this, such a variation in shape is preferable. Examples of the cause of unintended domain wall pinning include discontinuous changes in magnetic physical properties such as anisotropy energy on the magnetic grain boundaries in the magnetic nanowire 10. If there is a portion with a nanowire width change rate of 10% or higher in a region of 6 nm in length in the first direction between a minimal region and a maximal region in the magnetic nanowire 10, unintended domain wall pinning due to a 10% change of the anisotropy energy can be avoided. Here, the nanowire width change rate in a region D is the ratio $2|W_1-W_2|/(W_1+W_2)$ of the difference $|W_1-W_2|$ between a value $W_1$ of the nanowire width at one end of the region D and a value $W_2$ at the other end to the mean value $(W_1+W_2)/2$. In an example case illustrated in FIG. 26, the nanowire width at one end of the region D of 6 nm in length is 32.8 nm, and the nanowire width at the other end is 37.9 nm. Accordingly, the nanowire width change rate is 14%. However, if the nanowire width change $|W_1-W_2|$ in the region D is extremely large, pinning is caused. Therefore, the above described change $|W_1-W_2|$ is preferably not larger than 10 nm.

Figure 16:
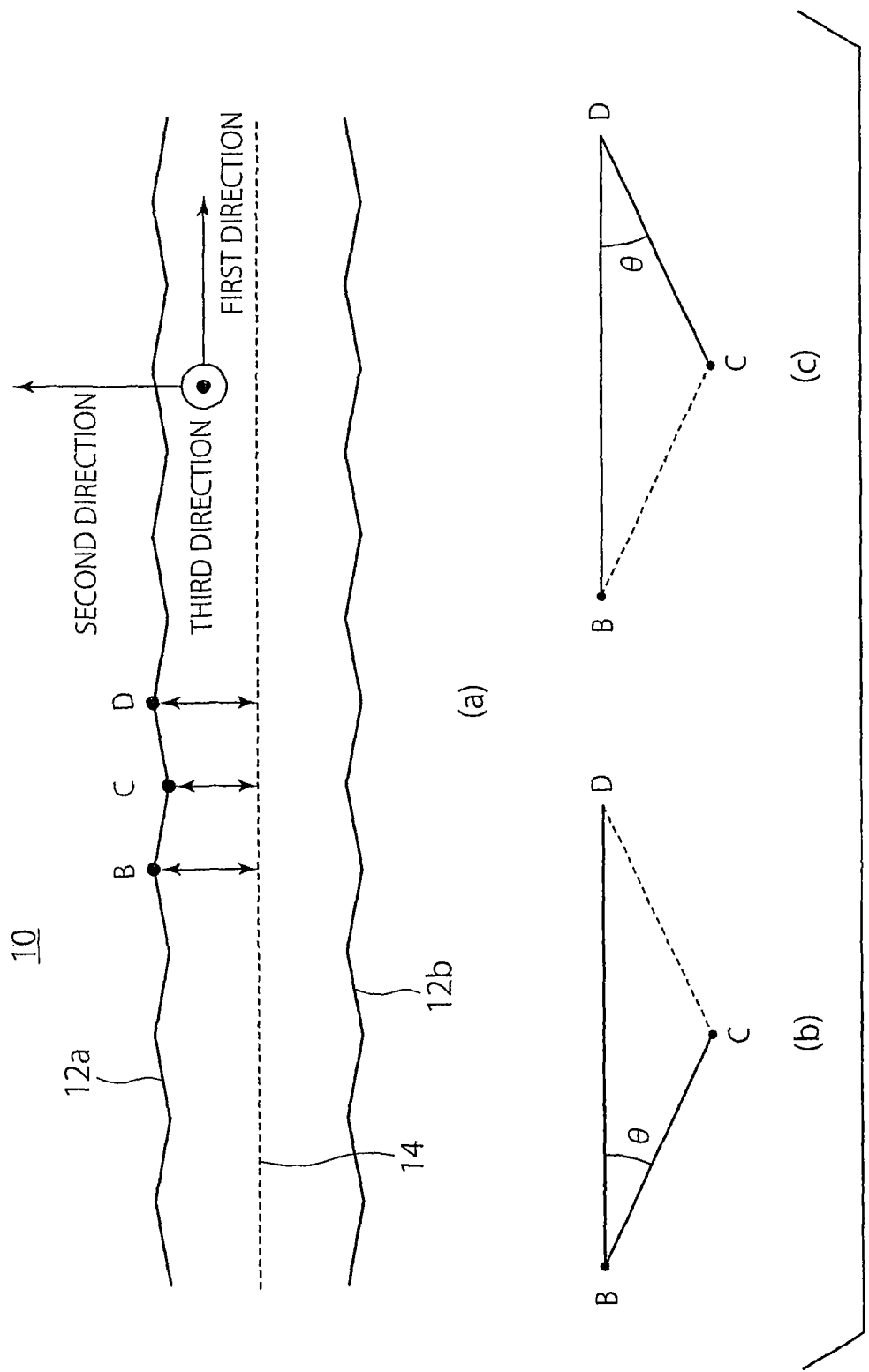
FIGS. 16($a$) through 16($c$) are diagrams for explaining the shape of the magnetic nanowire.

Instead of the reference points A, B, and C on the visible outline 12a shown in FIG. 2(a), reference points B, C, and D may be set as shown in FIG. 16(a). In this example, maximal points that are located on the visible outline 12a and are adjacent to each other with respect to the distance from the straight line 14 to the visible outline 12a are set as maximal points B and D. On the visible outline 12a between the maximal points B and D, the point at which the distance to the straight line 14 becomes shortest is selected as the minimal point C. As shown in FIG. 16(b) or 16(c), the visible outline 12a has such a shape that an angle θ that is the angle CBD or CDB is not smaller than four degrees and not larger than 30 degrees. The points B, C, and D serve as the reference points for determining the shape of the visible outline 12a.

Figure 17:
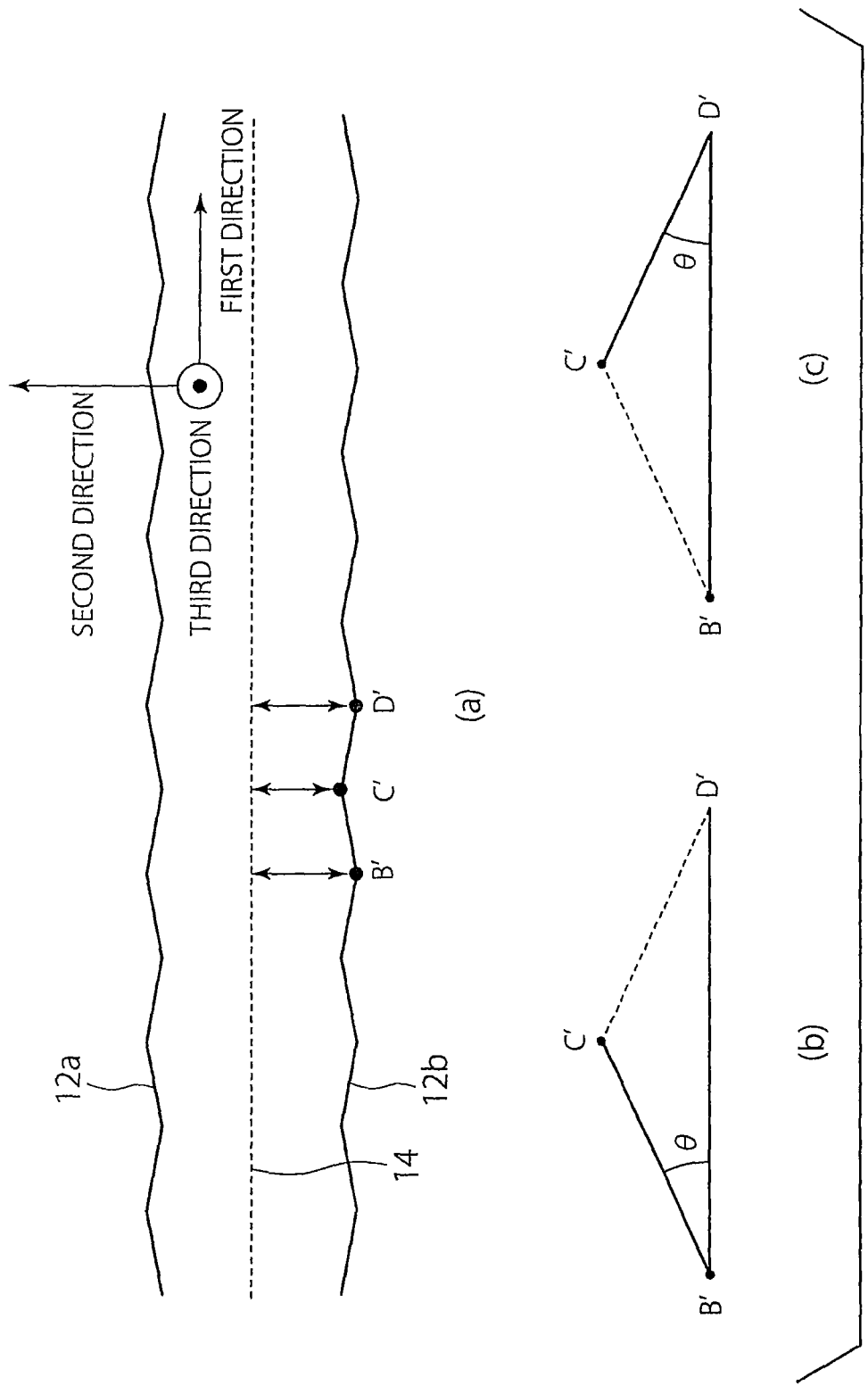
FIGS. 17($a$) through 17($c$) are diagrams for explaining the shape of the magnetic nanowire.

Also, instead of the reference points A', B', and C' on the visible outline 12b shown in FIG. 3(a), reference points B', C', and D' may be set as shown in FIG. 17(a). In this example, maximal points that are located on the visible outline 12b and are adjacent to each other with respect to the distance from the straight line 14 to the visible outline 12b are set as maximal points B' and D'. On the visible outline 12b between the maximal points B' and D', the point at which the distance to the straight line 14 becomes shortest is selected as the minimal point C'. As shown in FIG. 17(b) or 17(c), the visible outline 12b has such a shape that an angle θ that is the angle C'B'D' or C'D'B' is not smaller than four degrees and not larger than 30 degrees. The points B', C', and D' serve as the reference points for determining the shape of the visible outline 12b.

Figure 27:
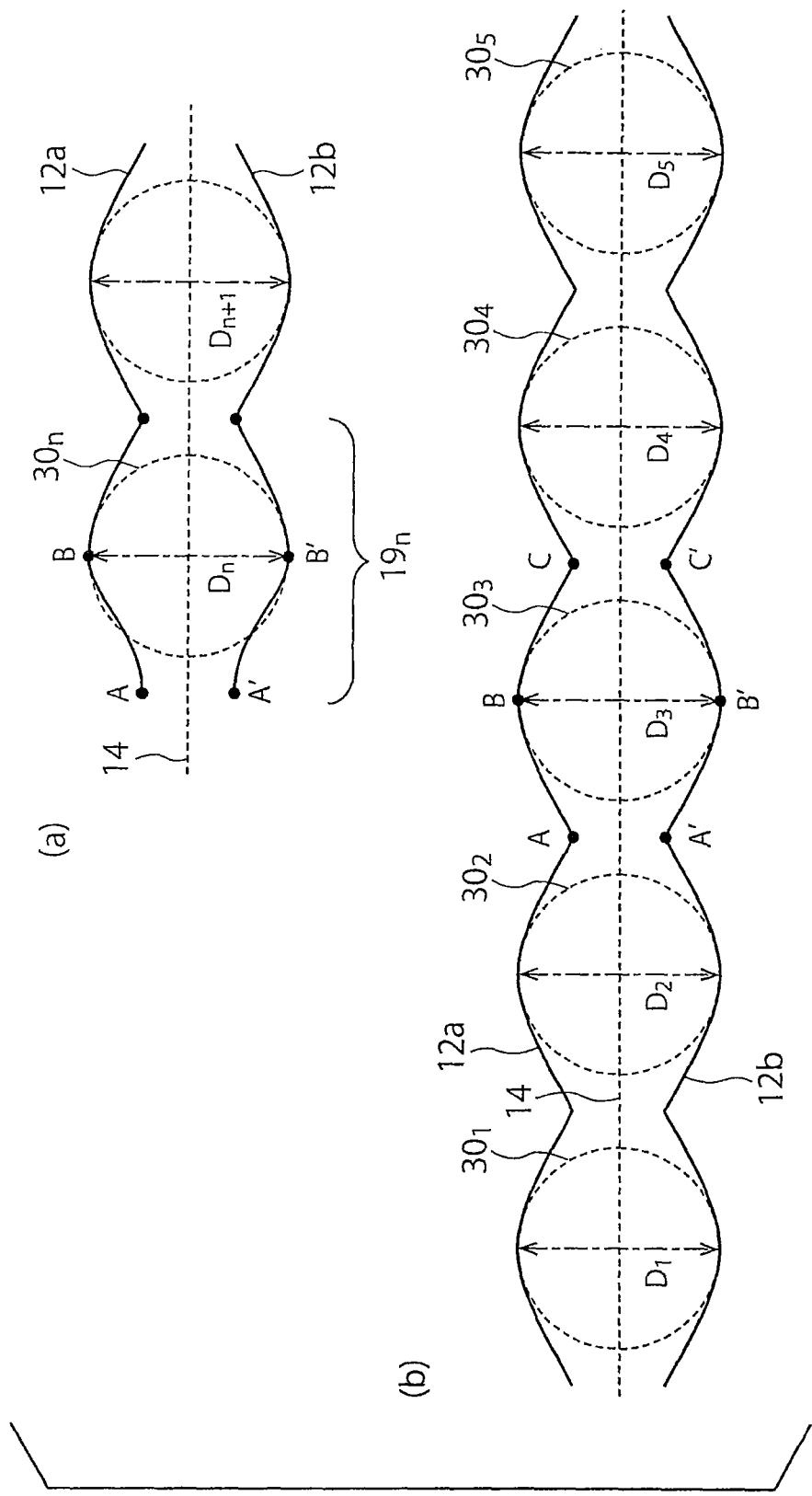
FIGS. 27($a$) and 27($b$) are diagrams for explaining preferred shapes of magnetic nanowires.

As described above, the visible outlines 12a and 12b of the magnetic nanowire 10 each have such a shape that the angle formed between the straight line connecting minimal points that differ from each other and the straight line connecting one of the minimal point to a maximal point is not smaller than four degrees and not larger than 30 degrees. Further, at least one of the visible outlines 12a and 12b preferably includes points that are located on or outside the circumference of a circle having a diameter that is a line segment connecting a first maximal point and a second maximal point that exists on the second direction side of the first maximal point. In FIG. 27(a), the angle formed between a maximal point and a minimal point on each of the two visible outlines 12a and 12b is not smaller than four degrees and not larger than 30 degrees. Further, in a region $19_n$ surrounded by a first minimal point A, a first maximal point B, a second minimal point A', and a second maximal point B', the first and second visible outlines 12a and 12b include points that are located on or outside the circumference of a circle $30_n$ having a diameter $D_n$ that is the line segment connecting the first maximal point B and the second maximal point B'. The visible outlines 12a and 12B may partially exist inside the circle $30_n$. In such a case, however, points on the visible outlines 12a and 12b that are symmetrical about the center of the circle $30_n$ are preferably located outside the circle $30_n$. With this arrangement, the domain walls can be easily shifted while being maintained perpendicularly to the first direction, and an accurate shift can be effectively performed. FIG. 27(b) shows a magnetic nanowire that has five pairs of maximal points. In this case, either of the visible outlines 12a and 12b is located on or outside the circumferences of circles $30_i$ (i=1, ... ) formed with the respective maximal points, and such an arrangement is more desirable for shifts. The diameters $D_n$ of the circles $30_i$ (i=1, ... ) may vary with region.

Figure 28:
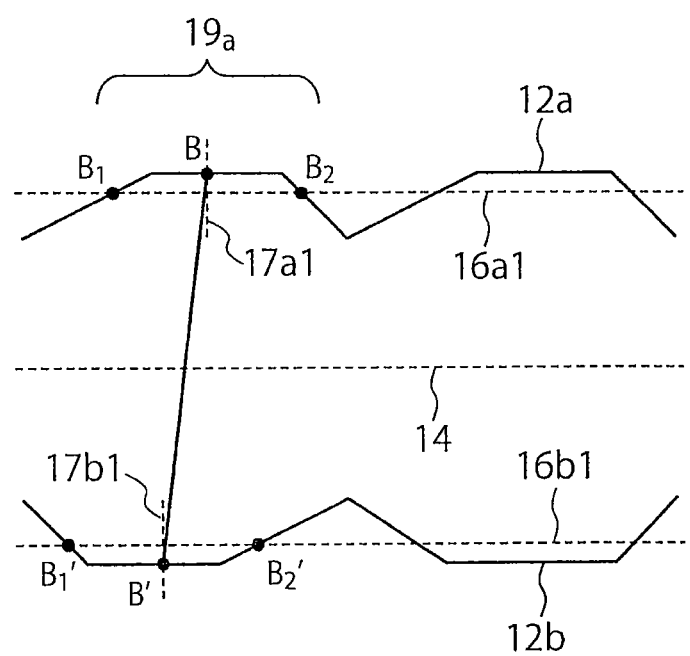
FIG. 28 is a diagram for explaining the settings of maximal points in a magnetic nanowire.

Referring now to FIG. 28, settings of the first maximal point B and the second maximal point B' in a case where there exists a (flat) maximal region 19a in which the nanowire width of the magnetic nanowire is almost constant are described. First, the point $B_1$ and the point $B_2$ are set in the same manner as in FIGS. 6(a) through 6(c). A straight line 17a1 that extends through the middle point between the point $B_1$ and the point $B_2$ and is perpendicular to the straight line 14 is then drawn, and the intersection point between the straight line 17a1 and the visible outline 12a is set as the first maximal point B. The second maximal point B' is set in the same manner. Specifically, a straight line 17b1 that extends through the middle point between the point $B_1'$ and the point $B_2'$ and is perpendicular to the straight line 14 is drawn, and the intersection point between the straight line 17b1 and the visible outline 12b is set as the second maximal point B'.

(Simulation Results)

Referring now to FIGS. 7(a) through 8(d), domain wall shift in the magnetic nanowire 10 is described.

The inventors discovered that collective shifting of bits could be performed only after properly setting the shape of the magnetic nanowire 10. In the following, the results of simulations performed to determine shift lengths of bits by changing the shape of the magnetic nanowire 10 are described. The simulations were performed by using a method of numerically solving the Landau-Lifshitz-Gilbert equation, which is a model that describes magnetization dynamics. In this manner, changes that occurred in the positions of the domain walls and the internal structure when current flowing in the first direction was applied to the magnetic nanowire 10 including magnetic domains could be determined. In the simulations, the shape of the magnetic nanowire 10 was set as shown in FIGS. 7(a) and 7(b). The minimum width W' of the nanowire was fixed at 10 nm, the distance from a minimal position with respect to the nanowire width to another minimal position (a magnetic domain length) $L_p$ was 36 nm, the film thickness was 15 nm, and the length of the magnetic nanowire 10 in the first direction was 144 nm. Here, the length in the first direction is a periodic boundary condition, and the length of the magnetic nanowire 10 is substantially infinite. The magnetic nanowire 10 had such a shape that the inclination angle θ of the visible outline 12a was in the range of 24.0 to 37.0 degrees. This angle θ was the angle formed by the line connecting two points at which the nanowire width becomes minimal and the line connecting one of the minimal points to a maximal point. Where the inclination angle θ is not smaller than four degrees and not larger than 30 degrees, this embodiment is realized. The values of maximum widths W of the magnetic nanowire 10 in respective cases range from 26 to 38 nm as shown in the table shown in FIG. 7(b).

The inclination angle θ of 24.0 degrees in Example 1 shown in FIG. 7(b) and the inclination angle θ of 29.0 degrees in Example 2 shown in FIG. 7(b) satisfy the condition that the inclination angle θ should fall within the range of four to 30 degrees as in this embodiment. The inclination angle θ of 33.7 degrees in Comparative Example 1 shown in FIG. 7(b) and the inclination angle θ of 37.9 degrees in Comparative Example 2 shown in FIG. 7(b) do not fall within the range of four to 30 degrees.

The magnetic material forming the magnetic nanowire 10 has a saturation magnetization of 600 emu/cm$^3$, an anisotropy energy of $1.1 \times 10^7$ erg/cm$^3$, an exchange stiffness of $1.0 \times 10^{-6}$ erg/cm, and an easy axis of magnetization in the film thickness direction. The anisotropy energy is determined by taking into account a spatial variation of 10% standard deviation.

In the above mentioned Examples 1 and 2 and Comparative Examples 1 and 2, the value of the current applied to the magnetic nanowire 10 via the electrodes 20 and 22 shown in FIG. 1 was $7.5 \times 10^7$ A/cm$^2$, and the dynamics of domain wall shift were determined through simulations under the condition that the current was applied but was cut off halfway through. The simulation results are shown in FIGS. 8(a) through 8(d). FIGS. 8(a) through 8(d) show snapshots, in chronological order, of magnetization distributions observed in cases where current was applied in an initial state in which a domain wall existed in each position where the nanowire width became minimal, and the current application was cut off when the domain walls indicated by the arrows in the drawing were shifted approximately 36 nm in the magnetic nanowires of Example 1, Example 2, Comparative Example 1, and Comparative Example 2. The shading of color indicates the magnetization-direction component in the direction of the easy axis of magnetization (a direction perpendicular to the plane of the drawing sheet), and the white portions and the black portions each indicate that the magnetization direction at the corresponding portion is the positive direction or the negative direction of the easy axis of magnetization.

As can be seen from the simulation results, position control becomes difficult when the inclination angle θ exceeds 30 degrees, because the domain walls being shifted greatly deviate from the direction perpendicular to the first direction. In Comparative Examples 1 and 2, some of the domain walls that existed in the initial state vanished during the shift. This means that some of the bit information was lost. This situation did not basically change even when the timing to cut off the current was altered to some degree.

In Examples 1 and 2, on the other hand, all the domain walls that existed in the initial state were maintained in the final stage. This means that the domain wall shift was accurately performed.

The above simulation results are merely examples. However, in a system in which physical properties such as the value of the saturation magnetization and the value of the anisotropy energy greatly differ from the above, the shapes of domain walls being shifted are normally disturbed only within a certain range, and the positions of the domain walls being shifted can be accurately controlled by pulsed current, as long as the magnetic nanowire has an inclination angle θ of 30 degrees or less.

Next, the reason that domain walls can be collectively controlled when the inclination angle is four degrees or greater is described based on the results of other simulations.

Figure 9:
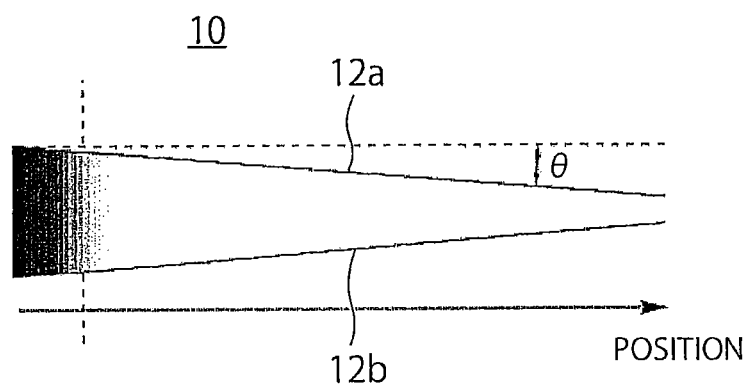
FIG. 9 is a diagram for explaining the conditions for simulations.

As shown in FIG. 9, these simulations were performed by using a method of numerically solving the Landau-Lifshitz- Gilbert equation to determine the dynamics of domain wall shift without current application to the magnetic nanowire 10 in which the visible outlines 12a and 12b have the inclination angle θ with respect to the first direction.

The magnetic material forming the magnetic nanowire 10 has a saturation magnetization of 600 emu/cm$^3$, an anisotropy energy of $8 \times 10^6$ erg/cm$^3$, an exchange stiffness of $1.0 \times 10^{-6}$ erg/cm, and an easy axis of magnetization in the film thickness direction.

FIGS. 10(a) through 10(d) are diagrams showing the simulation results of Example 3, Example 4, Comparative Example 3, and Comparative Example 4. In Example 3, Example 4, Comparative Example 3, and Comparative Example 4, the magnetic nanowires have inclination angles θ of 4.57 degrees (Example 3), 4.00 degrees, 3.48 degrees, and 2.86 degrees. FIGS. 10(a) through 10(d) show position changes observed in cases where domain walls having various initial states were left. These simulations were supposedly performed to determine in which direction the domain walls being shifted in the magnetic nanowire 10 would be shifted after the current supply was cut off. As shown in FIG. 9, the direction in which the width of the magnetic nanowire 10 becomes smaller is the positive direction.

Figure 10:
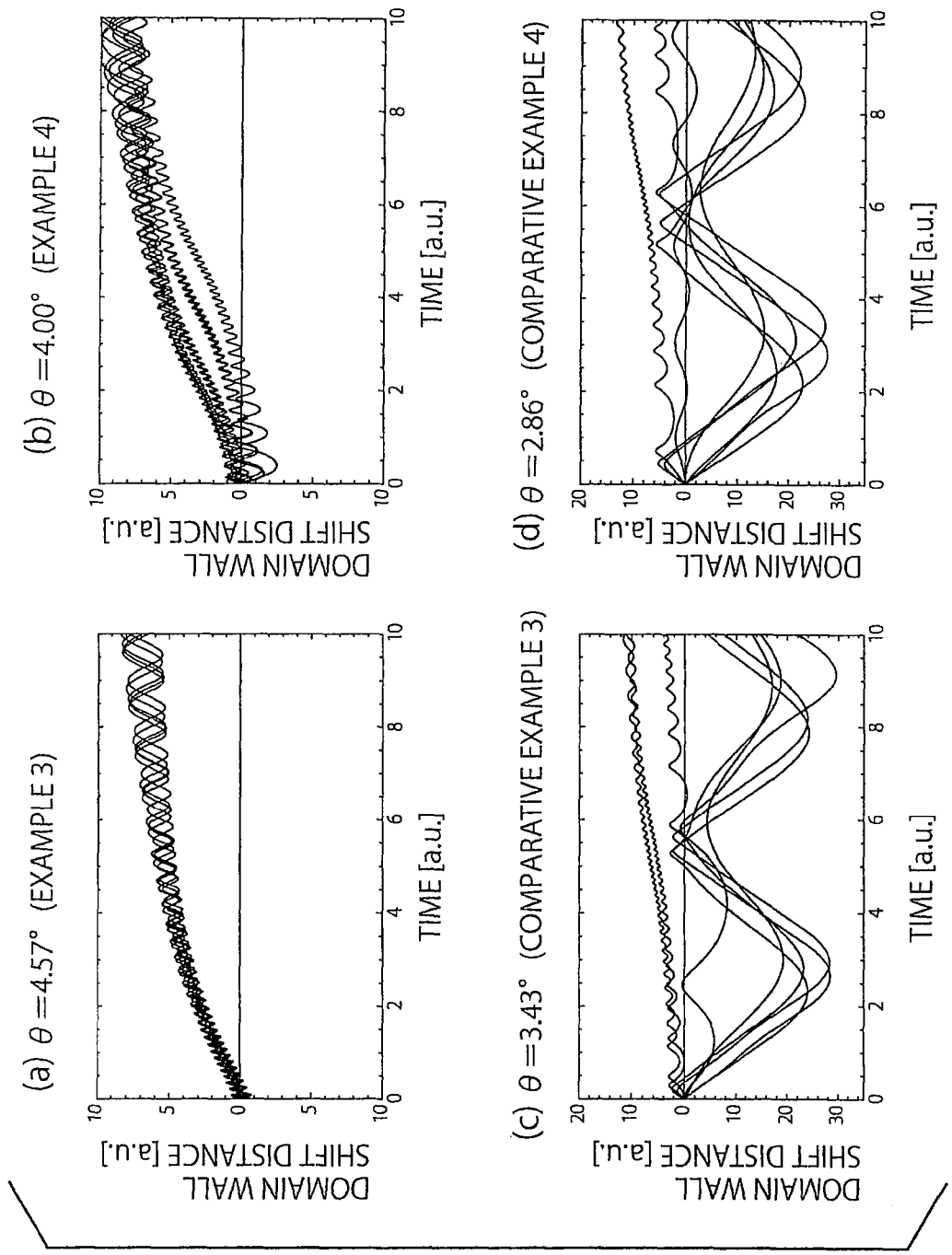
FIGS. 10($a$) through 10($d$) are diagrams showing the results of the simulations.

As can be seen from FIGS. 10(a) and 10(b), in cases where the inclination angle θ is four degrees or greater as in Examples 3 and 4, the direction of domain wall shift is uniquely determined not depending on the initial state even though current is not applied. That is, the domain walls are shifted in the direction in which the nanowire width becomes smaller. This is because, where the total sum of the perpendicular magnetic anisotropy energy of the domain walls is substantially proportional to the volume of the domain wall regions, the consumption of the perpendicular magnetic anisotropy energy can be reduced as the domain walls are shifted in the direction in which the nanowire width becomes smaller.

In Comparative Example 3 illustrated in FIG. 10(c) and Comparative Example 4 illustrated in FIG. 10(d), on the other hand, the domain walls are not shifted in one direction. These examples indicate that, in a case where the inclination angle is not sufficiently large or where the dependence of the nanowire width on positions is not sufficient, a sufficient gain of the perpendicular magnetic anisotropy energy cannot be achieved even when the positions of the domain walls change.

As can be seen from the above simulation results, the inventors have discovered that, in a magnetic nanowire having an inclination angle θ of four degrees or greater, positions can be self-corrected after a current supply is cut off, and the positions of domain walls can be collectively controlled not depending on physical properties such as the value of the saturation magnetization and the size of the magnetic anisotropy energy, even if there are variations in the shape of the current pulse.

Figure 29:
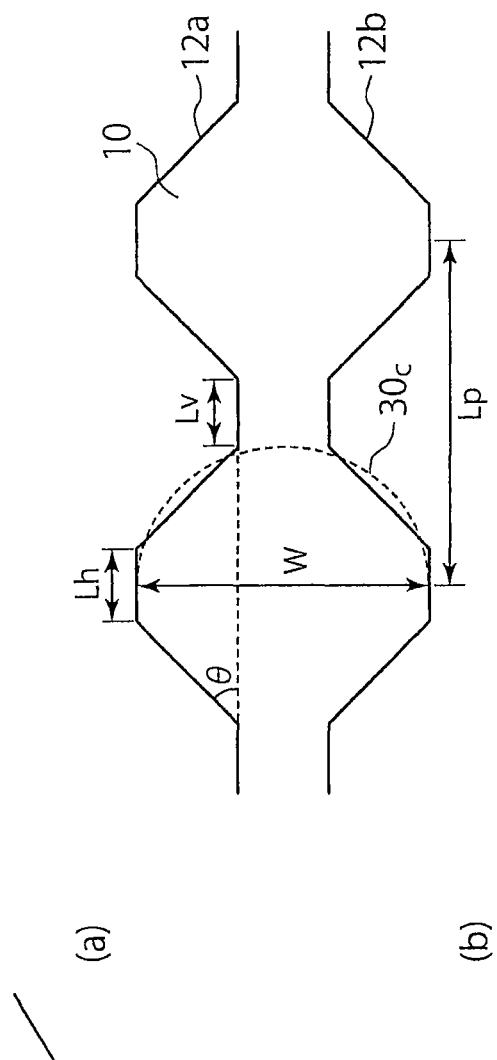
FIGS. 29($a$) and 29($b$) are diagrams for explaining the results of other simulations.
Figure 30:
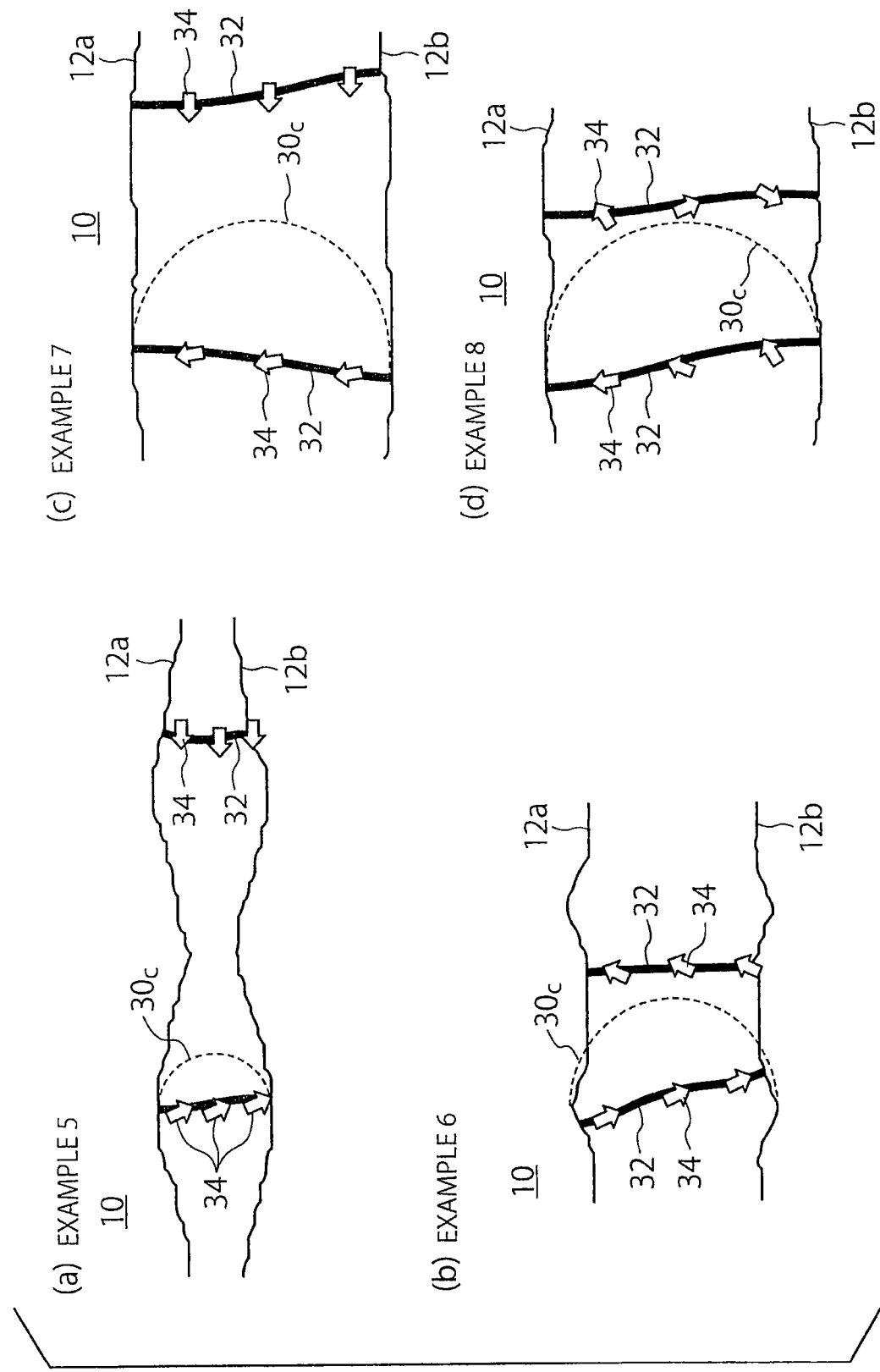
FIGS. 30($a$) through 30($d$) are diagrams showing the shapes of magnetic nanowires of Examples 5 through 8.

FIGS. 29(a) and 29(b) show the results of further simulations. These simulations were performed by using a method of numerically solving the Landau-Lifshitz-Gilbert equation to introduce magnetic domains into the magnetic nanowire 10 having visible outlines in an initial state as shown in the solid lines in FIG. 29(a) and to determine dynamics of the domain walls when current was applied in the first direction. FIGS. 30(a) through 30(d) and FIGS. 31(a) through 31(c) show examples of positions and shapes of domain walls 32 being shifted in cases where the sizes Lp, W, Lh, and Lv, and the value of the inclination angle θ in FIG. 29(a) were set at the values shown in FIG. 29(b). FIG. 29(b) also shows the film thicknesses t of the magnetic nanowires 10 used in the simulations, and the values of the saturation magnetizations Ms and the anisotropy energies Ku of the magnetic materials. The circular arcs $30_c$ indicated by dashed lines in FIG. 29(a), FIGS. 30(a) through 30(d), and FIGS. 31(a) through 31(c) each indicate a semicircle having a diameter that is the line segment connecting the first maximal point and the second maximal point. The examples illustrated in FIGS. 30(a) through 30(d) are Examples 5 through 8, and, in these examples, the inclination angles θ fall within the range of four to 30 degrees. The examples illustrated in FIGS. 31(a) through 31(c) are Comparative Examples 5 through 7, and, in these examples, the inclination angles θ exceed 30 degrees.

In Examples 5 through 8, the domain walls 32 can be collectively controlled. Particularly, Example 5 is preferable to Examples 6 through 8, as the magnetization directions 34 in the domain walls 32 are uniform even during the shift, and the domain walls 32 maintain a direction perpendicular to the first direction in Example 5. The shape of the magnetic nanowire 10 of Example 5 is characterized in that the visible outlines 12a and 12b are located on the circle having a diameter that is the line segment connecting the first maximal point and the second maximal point, and the size W in the direction perpendicular to the first direction is 60 nm or less. At least part of the visible outlines 12a and 12b should be located outside the circle having the diameter that is the line segment connecting the first maximal point and the second maximal point, because the domain walls 32 during the shift can easily maintain the direction perpendicular to the first direction, and variations in the shift rate of the domain walls 32 can be reduced with such an arrangement. Also, as can be seen from FIGS. 30(a) through 30(c), the size W in the direction perpendicular to the first direction should be 60 nm or less, because the magnetization directions 34 in the domain walls 32 easily become uniform, and variations in the shift rate of the magnetic domains can be reduced with such an arrangement.

In each of Comparative Examples 5 and 6 illustrated in FIGS. 31(a) and 31(b), the inclination angle θ exceeds 30 degrees, and the size W of the magnetic nanowire in the second direction is larger than 60 nm. As a result, the curves of the domain walls 32 during the shift become conspicuously steep, and collective control becomes difficult. Also, in each of Comparative Examples 5 and 7 illustrated in FIGS. 31(a) and 31(c), the inclination angle θ exceeds 30 degrees, and the visible outlines 12a and 12b of the magnetic nanowire are located inside the circular arc $30_c$ having a diameter that is the line segment connecting the first maximal point and the second maximal point. As a result, the domain walls 32 rotate conspicuously, and collective control becomes difficult.

(Writing and Reading)

Figure 11:
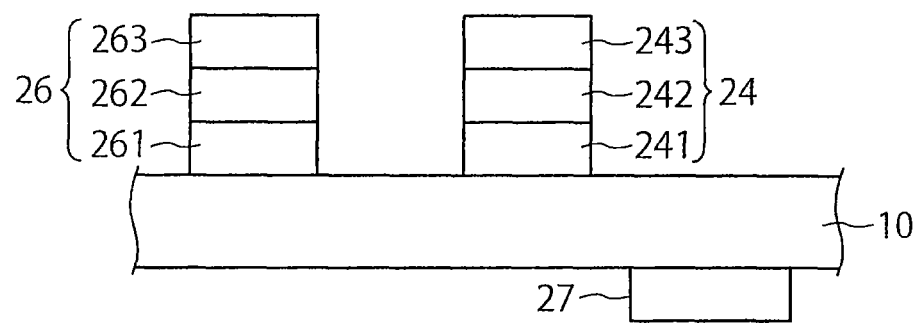
FIG. 11 is a cross-sectional view showing the writing unit and the reading unit.
Figure 12:
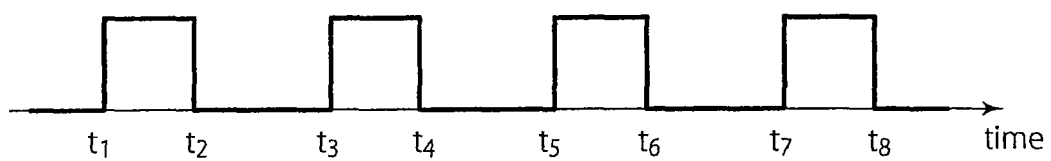
FIG. 12 is a waveform chart of the current pulse for domain wall shift.
Figure 13:
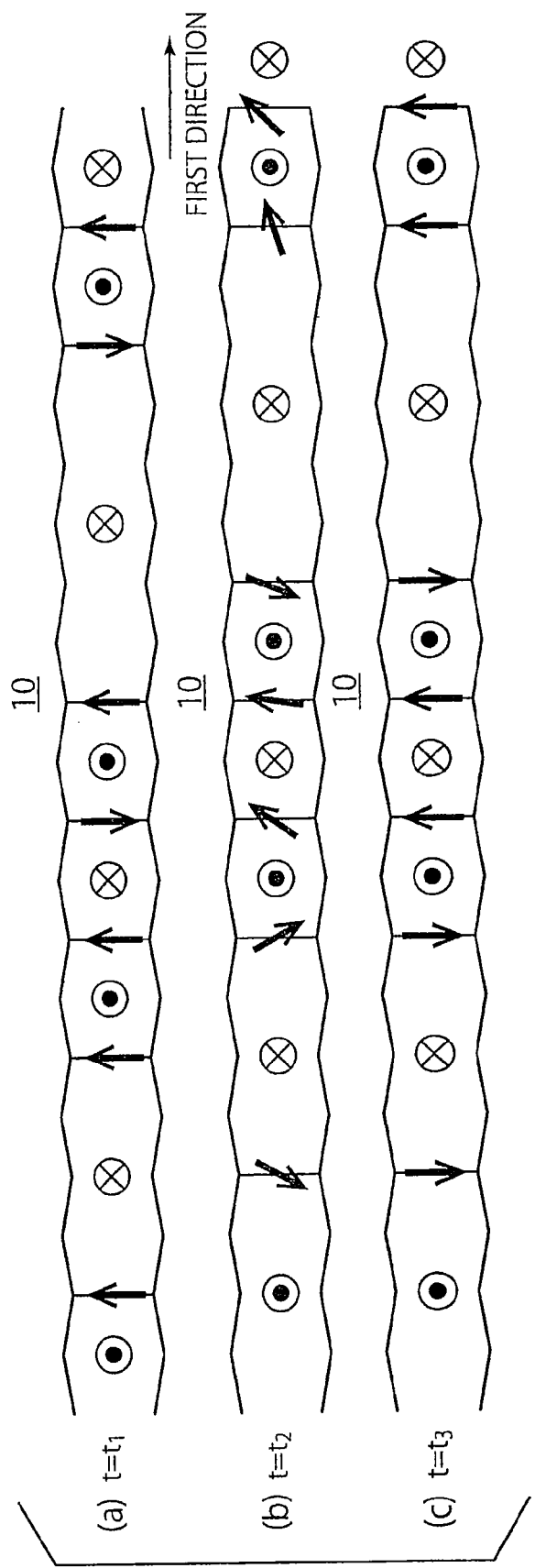
FIGS. 13($a$) through 13($c$) are diagrams showing changes in the magnetization in the domain walls at the time of domain wall shift.

Referring now to FIGS. 11 through 13, writing and reading in the magnetic storage element 1 of this embodiment are described.

As shown in FIG. 11, the writing unit 26 has a structure formed by stacking a nonmagnetic layer 261, a ferromagnetic layer 262 having a pinned magnetization direction, and an electrode 263 in this order. The writing unit 26 is connected to the magnetic nanowire 10. A signal source (not shown) is connected to the electrode 263. At the time of writing, a potential is applied from the signal source to the electrode 263. Electrons then flow between the electrode 263 and an electrode 27 via the magnetic nanowire 10. When electrons flow from the ferromagnetic layer 262 toward the magnetic nanowire 10, electrons that are spin-polarized in the magnetization direction of the ferromagnetic layer 262 flow. As the spin-polarized electrons flow, the magnetization direction of the magnetic nanowire 10 becomes the same as the magnetization direction of the ferromagnetic layer 262. To cause the magnetic nanowire 10 to have a magnetization direction that is the opposite of (antiparallel to) the magnetization direction of the ferromagnetic layer 262, electrons are made to flow from the electrode 27 to the nonmagnetic layer 261, the ferromagnetic layer 262, and the electrode 263 via the magnetic nanowire 10. Although writing is performed by causing electrons to flow between the electrode 27 and the electrode 263 of the writing unit 26 as described above, a lower electrode (not shown) may be provided on the opposite side of the magnetic nanowire 10 from the writing unit 26, and writing may be performed by causing electrons to flow between the lower electrode and the electrode 263 via the magnetic nanowire 10.

Meanwhile, the reading unit 24 has a structure formed by stacking a nonmagnetic layer 241, a ferromagnetic layer 242 having a pinned magnetization direction, and an electrode 243 in this order. The reading unit 24 is connected to the magnetic nanowire 10. When the magnetization direction of the magnetic domain of the magnetic nanowire 10 to which the reading unit 24 is connected is the same as the magnetization direction of the ferromagnetic layer 242, a high-resistance state is formed between the electrode 243 and the electrode 27. When the magnetization direction of the magnetic domain of the magnetic nanowire 10 to which the reading unit 24 is connected is the opposite of (antiparallel to) the magnetization direction of the ferromagnetic layer 242, a low-resistance state is formed between the electrode 243 and the electrode 27. By reading the change in resistance, recorded information can be read. In this manner, reading is performed by applying current to the magnetic nanowire 10 located between the reading unit 24 and the electrode 27. Therefore, the reading unit 24 and the electrode 27 are preferably located close to each other. Although the electrode 27 is used for both writing and reading, separate electrodes may be provided. Although reading is performed by applying current between the electrode 27 and the electrode 243 of the reading unit 24 as described above, a lower electrode (not shown) may be provided on the opposite side of the magnetic nanowire 10 from the reading unit 24, and reading may be performed by causing electrons to flow between the lower electrode and the electrode 243 via the magnetic nanowire 10.

(Domain Wall Shift Process)

In the magnetic storage element 1 of this embodiment, bit data stored in the magnetic nanowire 10 can be moved by the later described domain wall shift process, without a change in the bit data sequence. Accordingly, writing or reading can be performed in a desired bit data position by shifting the positions of domain walls by a necessary distance prior to the writing or reading.

A method of shifting domain walls included in the magnetic nanowire 10 by an intended distance in the first direction in the magnetic storage element 1 of this embodiment is now described. This method is implemented by using the pulsed current shown in FIG. 12. The method includes step S1 of applying current between the electrode 20 and the electrode 22 during the period from time $t_1$ to time $t_2$ as shown in FIG. 12, and step S2 of cutting off the current and standing by during the period from time $t_2$ to time $t_3$. An example of the pulse waveform is the rectangular pulse shown in FIG. 12, but the pulse waveform is not limited to this example. The pulse waveform may have a finite rise time and fall time, an overshoot, and the like.

FIGS. 13(a) through 13(b) schematically show changes in magnetization distribution that occur in the magnetic nanowire 10 through steps S1 and S2. FIG. 13(a) shows the magnetization direction distribution in a region of the magnetic nanowire 10 at time $t=t_1$. In this magnetic nanowire 10, the easy axis of magnetization is perpendicular to the plane of the drawing sheet. The magnetization direction in each magnetic domain is perpendicular to the plane of the drawing sheet, and extends forward or backward. At this point ($t=t_1$), domain walls exist in the vicinities of points at which the nanowire width becomes minimal. This is because most of the domain wall energy is the energy derived from magnetic anisotropy in the magnetic nanowire 10 made of a perpendicular magnetization material, and domain walls having smaller volumes are more stable in terms of energy. The magnetization direction at the center of each domain wall is perpendicular to the direction of the easy axis of magnetization, and is a direction in the plane of the drawing sheet in FIG. 13(a). In the example illustrated in FIG. 13(a), Bloch walls oriented in a direction perpendicular to the first direction are stable.

When current is applied to the magnetic nanowire 10 located between the electrode 20 and the electrode 22 shown in FIG. 1 (step S1), the current flowing in the magnetic nanowire 10 is spin-polarized, and spin torque is applied between the magnetization of the magnetic domains forming the magnetic nanowire 10 and the magnetization of adjacent magnetic domains. Therefore, the domain walls in the magnetic nanowire 10 are substantially shifted in a uniform manner. The direction of domain wall shift is equal to the traveling direction of electrons. That is, the direction of domain wall shift is the opposite direction from the direction in which the current flows. FIG. 13(b) shows the magnetization distribution in the magnetic nanowire 10 at the time when the current is cut off ($t=t_2$). Since there are variations in shape and variations in magnetic physical properties that occur during manufacturing, the shift distances of the respective domain walls during the period from time $t_1$ to time $t_2$ are not perfectly uniform. However, the shift distances are almost the same, and, at the time $t=t_2$, the respective domain walls exist in the vicinities of the points at which the nanowire width becomes minimal. While the domain walls move in the magnetic nanowire 10, the magnetization directions at the centers of the domain walls rotate. Since the rotation speed is sensitive to variations, the magnetization directions are not uniform when the current is cut off.

Figure 14:
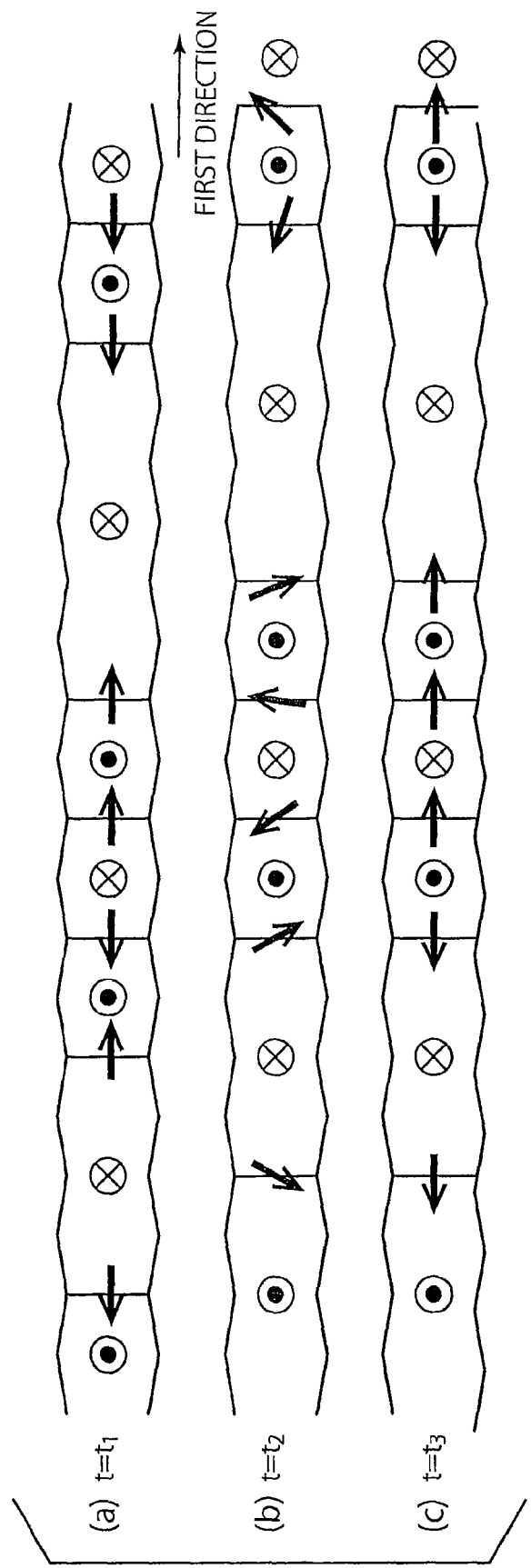
FIGS. 14($a$) through 14($c$) are diagrams showing changes in the magnetization in the domain walls at the time of domain wall shift.

When a certain period of standby time has passed (the period from time $t_2$ to time $t_3$) since the cutoff of the current, the non-uniformity is alleviated as shown in FIG. 13(c). The positions of the domain walls are adjusted to the points at which the nanowire width becomes minimal, and the magnetization angle at the center of each domain wall is stabilized. The magnetic nanowire shown in FIGS. 13(a) through 13(c) is in a Bloch wall state. That is, as a sufficient relaxation time is allowed in a magnetic nanowire that has a varying nanowire width as in this embodiment, the above described adjustment mechanism functions, and the positions of domain walls can be adjusted to the points at which the nanowire width becomes minimal FIGS. 14(a) through 14(c) illustrate a case where the magnetization direction at the center of each domain wall is the first direction, or the domain walls in the magnetic nanowire 10 are Neel walls. In this case, the magnetization directions at the centers of the domain walls rotate when domain wall shift is started as in the case of Bloch walls, and Neel walls reappear when the current is cut off.

Next, the standby time (the relaxation time constant) before the domain walls are in equilibrium at the time of domain mall shift is described. After the current is cut off, the magnetization directions at the centers of the domain walls continue to rotate for a certain period of time, and it is known that the relaxation time constant $t_r$ is expressed as $t_r = L_{dw}/(2\alpha u_c)$. Here, $L_{dw}$ represents the length of each domain wall in the first direction (also referred to as the domain wall width). Meanwhile, α represents the damping constant of the magnetic nanowire 10, and is approximately 0.1 at a maximum though depending on the material forming the magnetic body. Also, $u_c$ represents the lowest shift rate (the time average) obtained through domain wall shift by the current.

A material having a large damping constant α has state relaxation even if the standby time is short, and accordingly, such a material is suitable for high-speed operations. Examples of magnetic materials having a damping constant α of approximately 0.1 include an alloy of a rare earth and a transition metal.

On the other hand, the maximum time required for shifting a domain wall from a minimal point of the nanowire width to the next minimal point of the nanowire width is expressed as $L_p/u_c$, using the length $L_p$ from the minimal point of the nanowire width to the next minimal point of the nanowire width in the first direction, and the lowest speed $u_c$.

In an example case where an alloy of a rare earth and a transition metal that has an anisotropy energy Ku of $2.0 \times 10^6$ erg/cm$^3$, an exchange stiffness A of $0.4 \times 10^{-6}$ erg/cm, and a damping constant of 0.1 is used, the distance $L_p$ between adjacent minimal points of the nanowire width is 40 nm, and the domain wall shift rate u is 5 m/s, the current introduction time $t_p$ is expressed as $L_p/u=8$ ns. If the standby time $t_w$ is 10 ns, on the other hand, the standby time is sufficiently long, being longer than the relaxation time constant $t_r=9$ ns, which is determined by material parameters.

In general, the domain wall state can be relaxed and switched to an equilibrium state by making the standby time longer than the current introduction time, and high reliability can be ensured in operations to be performed to collectively shift a large number of domain walls included in the magnetic nanowire 10.

(Magnetic Materials)

Next, the material of the magnetic nanowire 10 of the magnetic storage element 1 according to the first embodiment is described. Any magnetic material that can have magnetization in a direction (the second direction or the third direction shown in FIG. 2) perpendicular to the extending direction of the magnetic nanowire 10 (the first direction shown in FIG. 2) can be used as the magnetic nanowire 10. In a case where the magnetic nanowire 10 is formed in a direction perpendicular to the substrate surface, the easy axis of magnetization of magnetic anisotropy needs to be in the film in-plane direction of the magnetic nanowire 10, so as to make the magnetization direction perpendicular to the magnetic nanowire 10. In a case where the magnetic nanowire 10 is formed in a direction parallel to the substrate surface, the easy axis of magnetization of magnetic anisotropy needs to be in a direction perpendicular to the film plane. In general, a greater demagnetizing field is generated in a case where the magnetization direction is perpendicular to the extending direction (the first direction) of the magnetic nanowire 10 than in a case where the magnetization direction is parallel to the extending direction (the first direction) of the magnetic nanowire 10. Therefore, to make the magnetization direction perpendicular to the first direction, a magnetic anisotropy large enough to overcome the demagnetizing field is required. In view of this, it is preferable to use a material having a large magnetic anisotropy energy Ku.

As a material having a large magnetic anisotropy energy Ku, any of the following materials can be used: alloys each formed by combining at least one element selected from the group consisting of iron (Fe), cobalt (Co), nickel (Ni), manganese (Mn), and chromium (Cr), and at least one element selected from the group consisting of platinum (Pt), palladium (Pd), iridium (Ir), ruthenium (Ru), and rhodium (Rh). Examples of such alloys include CoPt, CoCrPt, FePt, CoPd, and FePd. The value of the magnetic anisotropy energy Ku can be controlled by adjusting the composition of the magnetic material forming the magnetic layer, the crystalline order at the time of a heat treatment, or the like.

A magnetic material that has an hcp structure (a hexagonal close-packed structure) and has a magnetic anisotropy perpendicular to the extending direction (the first direction) of the magnetic nanowire 10 can also be used. Examples of such magnetic materials include Co, CoPt, FePt, or a Co/Ni film stack. A typical example material contains a metal having cobalt (Co) as the main component, but some other metal having an hcp structure can also be used.

A material that is an alloy of a rare-earth element and an iron-group transition element, and has a magnetic anisotropy perpendicular to the nanowire direction can also be used. Specific examples of such materials include GdFe, GdCo, GdFeCo, TbFe, TbCo, TbFeCo, GdTbFe, GdTbCo, DyFe, DyCo, and DyFeCo. Those example materials may be amorphous materials. In the case of TbFe, for example, TbFe has a perpendicular anisotropy when Tb is not less than 20 atomic % and not more than 40 atomic %. Further, in the case of any of the above materials, an additive element may be added.

The magnetic nanowire 10 preferably includes a portion formed in a direction perpendicular to the substrate, because, in such a case, the length of the magnetic nanowire 10 in the first direction can be made shorter, and the data amount that can be stored in the magnetic nanowire 10 can be increased.

Also, a nonmagnetic element, such as Ag, Cu, Au, Al, Mg, Si, Bi, Ta, B, C, O, N, Pd, Pt, Zr, Ir, W, Mo, Nb, or H, may be added to any of the above magnetic materials to be used as the magnetic layer. In this manner, magnetic properties can be adjusted, and other various physical properties such as crystalline properties, mechanical properties, and chemical properties can be adjusted.

The same material as the magnetic nanowire 10 can be used as the material of the ferromagnetic layers 262 and 242 of the writing unit 26 and the reading unit 24. Since each of the ferromagnetic layers 262 and 242 does not have an aspect ratio as high as that of the magnetic nanowire 10, the demagnetizing field is not large. Therefore, a magnetic material having a smaller magnetic anisotropy energy than that of the magnetic material used as the magnetic nanowire 10 may be used. For example, it is possible to use Co, Fe, Ni, or an alloy containing those elements. The thickness of each of the ferromagnetic layers 262 and 242 is preferably in the range of 0.6 nm to 100 nm. Where the material of the ferromagnetic layer 262 has higher spin polarization, the amount of current required for writing can be smaller. Therefore, it is preferable to use a material having high spin polarization. Also, where the material of the ferromagnetic layer 242 has higher spin polarization, the resistance change at the time of reading is larger, and reading is easier. Therefore, it is preferable to use a material having high spin polarization. In view of this, high-spin-polarization materials called half metals are ideal materials. Examples of half metals include Heusler alloys, rutile-type oxides, spinel-type oxides, perovskite oxides, double perovskite oxides, zinc blende chromium compounds, pyrite-type manganese compounds, and sendust alloys.

As the material of the nonmagnetic layers 261 and 241 of the writing unit 26 and the reading unit 24, a nonmagnetic metal or an insulating thin film can be used. As the nonmagnetic metal, it is possible to use Au, Cu, Cr, Zn, Ga, Nb, Mo, Ru, Pd, Ag, Hf, Ta, W, Pt, or Bi, or an alloy containing one or more of those elements. The magnetostatic coupling between the magnetic nanowire 10 and the ferromagnetic layers 262 and 242 is sufficiently small, and the thickness of each of the nonmagnetic layers 261 and 241 needs to be smaller than the spin diffusion length of each of the nonmagnetic layers 261 and 241. Specifically, the thickness of each of the nonmagnetic layers 261 and 241 is preferably in the range of 0.2 nm to 20 nm.

As for the insulating material that can be used as the nonmagnetic layers 261 and 241, the material of each of the nonmagnetic layers 261 and 241 can be made to function as a tunnel barrier layer, so as to effectively increase the magnetoresistance effect. In this case, $Al_2O_3$, $SiO_2$, MgO, AlN, $Bi_2O_3$, $MgF_2$, $CaF_2$, $SrTiO_3$, $AlLaO_3$, Al—N—O, Si—N—O, a nonmagnetic semiconductor, or the like can be used as the material of each of the nonmagnetic layers 261 and 241. As the nonmagnetic semiconductor, it is possible to use ZnO, InMn, GaN, GaAs, $TiO_2$, Zn, Te, or any of those materials doped with a transition metal. Those compounds do not necessarily have perfectly accurate compositions in terms of stoichiometry, and may have defects such as oxygen defects, nitrogen defects, or fluorine defects, or excess or deficiency of oxygen, nitrogen, fluorine, or the like. The thickness of each of the nonmagnetic layers 261 and 241 made of the insulating material is preferably in the range of 0.2 nm to 5 nm. In a case where each of the nonmagnetic layers 261 and 241 is made of the insulating material, pinholes may exist therein.

(Manufacturing Method)

Figure 15:
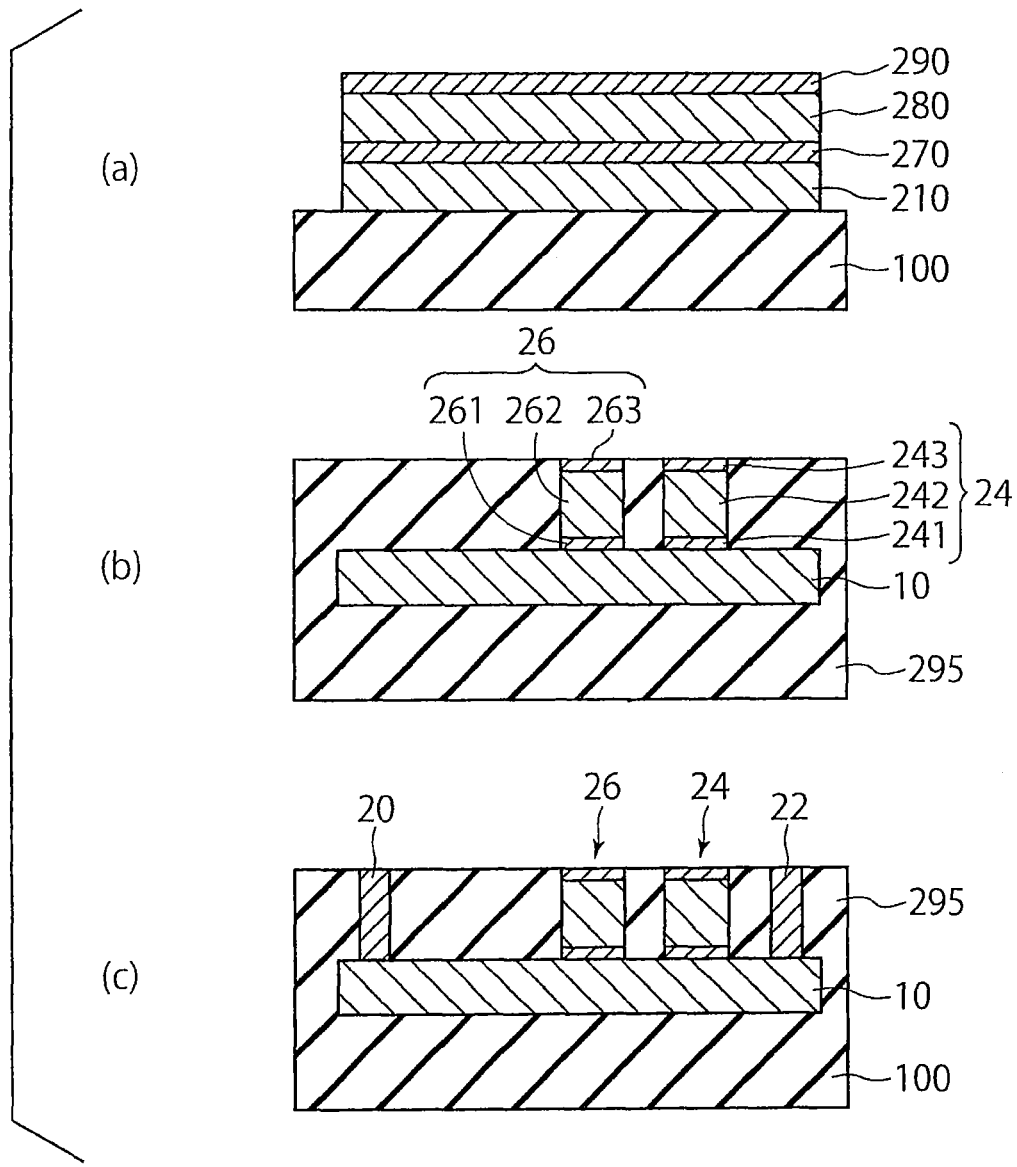
FIGS. 15($a$) through 15($c$) are cross-sectional views showing the procedures for manufacturing the magnetic storage element according to the first embodiment.

Referring now to FIGS. 15(*a*) through 15(*c*), a method of manufacturing the magnetic storage element 1 according to the first embodiment is described. The magnetic storage element 1 is manufactured by a film formation technique and a microfabrication technique. A specific example of the process for manufacturing the magnetic storage element 1 is as follows.

First, as shown in FIG. 15(*a*), a wafer (not shown) having an insulating film 100 formed on the upper surface thereof is prepared, and a magnetic layer 210, a nonmagnetic layer 270, a magnetic layer 280, and an electrode film 290 are formed in this order on the insulating film 100 (FIG. 15(*a*)). The magnetic layer 210 turns into the magnetic nanowire 10. Also, MgO is used as the material of the nonmagnetic layer 270, for example, and the nonmagnetic layer 270 turns into the nonmagnetic layer 241 of the reading unit 24 and the nonmagnetic layer 261 of the writing unit 26.

The magnetic layer 280 turns into the ferromagnetic layer 242 of the reading unit 24 and the ferromagnetic layer 262 of the writing unit 26. Also, Ta is used as the electrode film 290, for example, and the electrode film 290 turns into the electrode 243 of the reading unit 24 and the electrode 263 of the writing unit 26. The wafer having the magnetic layer 210, the nonmagnetic layer 270, the magnetic layer 280, and the electrode film 290 stacked therein is placed in a vacuum furnace in a magnetic field, and annealing is performed in the magnetic field at 270° C. for 10 hours, for example. In this manner, unidirectional anisotropies are given to the magnetic layers 210 and 280. After that, patterning is performed by using a lithography technique and RIE (Reactive Ion Etching), to form the electrode film 290, the magnetic layer 280, the nonmagnetic layer 270, and the magnetic layer 210 into the flat shape of the magnetic nanowire 10 (FIG. 15(*a*)).

Patterning is further performed by using a lithography technique and RIE, to form the electrode film 290, the magnetic layer 280, and the nonmagnetic layer 270 into the flat shape of the magnetic nanowire 10. In this manner, the reading unit 24 and the writing unit 26 are formed (FIG. 15(*b*)). After an interlayer insulating film 295 is deposited, the interlayer insulating film 295 is flattened by CMP (Chemical Mechanical Polishing), and the upper surfaces of the respective electrodes 243 and 263 of the reading unit 24 and the writing unit 26 are exposed (FIG. 15(*b*)).

Contact holes connecting to the magnetic nanowire 10 are then formed in the interlayer insulating film 295 by using a lithography technique and RIE. The contact holes are filled with a conductive film material, to form the electrodes 20 and 22 (FIG. 15(*c*)). In this manner, the magnetic storage element 1 is completed.

(Magnetic Nanowire Shapes)

The magnetic nanowire 10 can have various shapes. The magnetic nanowires 10 shown in FIGS. 18(*a*) and 18(*b*) are examples in which the distance $L_p$ from a point at which the nanowire width becomes minimal to the next point at which the nanowire width becomes minimal in the first direction varies with location. In the example illustrated in FIG. 18(*a*), the distance $L_p$ varies with location in the first direction at least in a region of the magnetic nanowire 10. In the example illustrated in FIG. 18(*b*), the distance $L_p$ becomes gradually longer in the first direction at least in one region of the magnetic nanowire 10. Alternatively, the distance $L_p$ may be made to become gradually shorter in the first direction.

Figure 18:
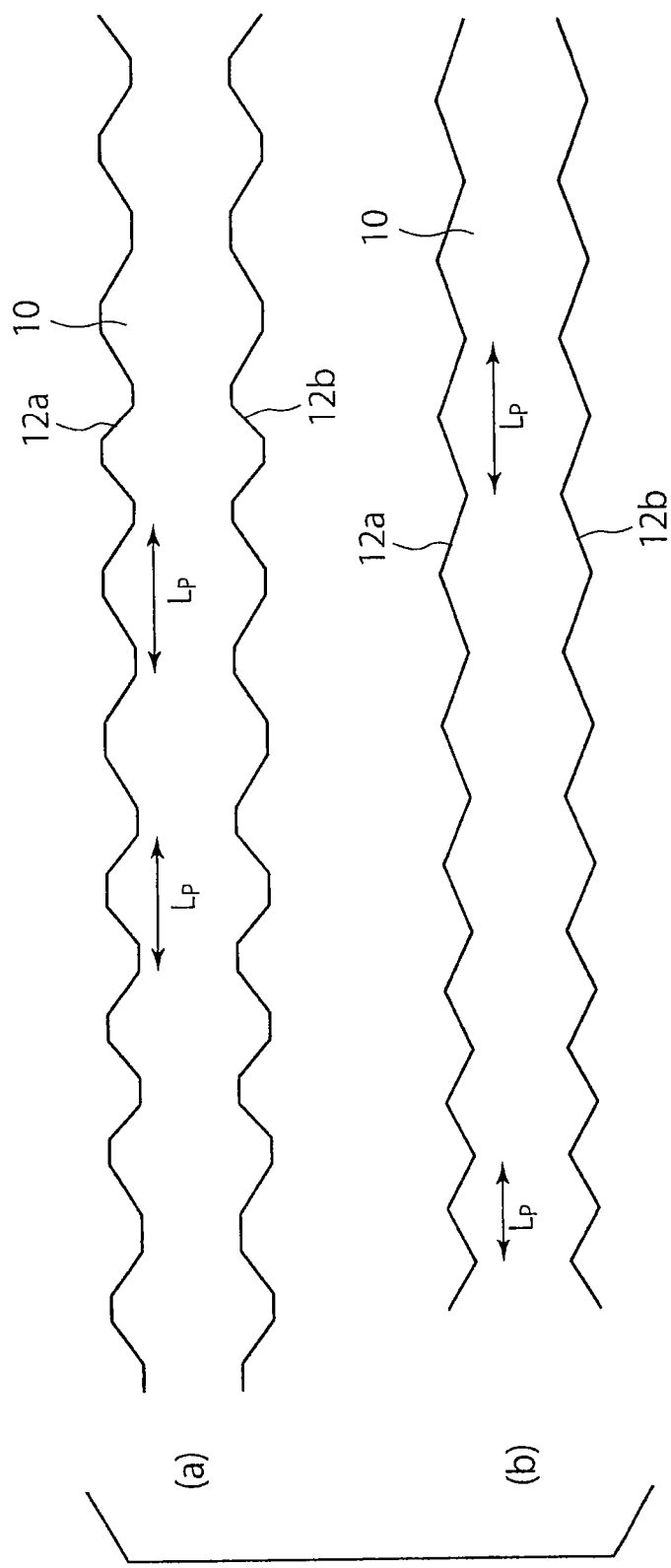
FIGS. 18($a$) and 18($b$) are diagrams for explaining the shape of the magnetic nanowire.

In a region having a length of 1 μm or less in the first direction in the magnetic nanowire 10, the distance $L_p$ preferably varies with location in the first direction as shown in FIG. 18(*a*). In the magnetic nanowire 10 having such features, the distance between two adjacent domain walls varies every time the domain walls are collectively shifted from a point at which the width becomes minimal to the next point at which the width becomes minimal. By virtue of such variations, interactions between adjacent domain walls vary during the shift, and the possibility that bits are lost or the displacement is disturbed due to the interactions between domain walls becomes lower.

Figure 19:
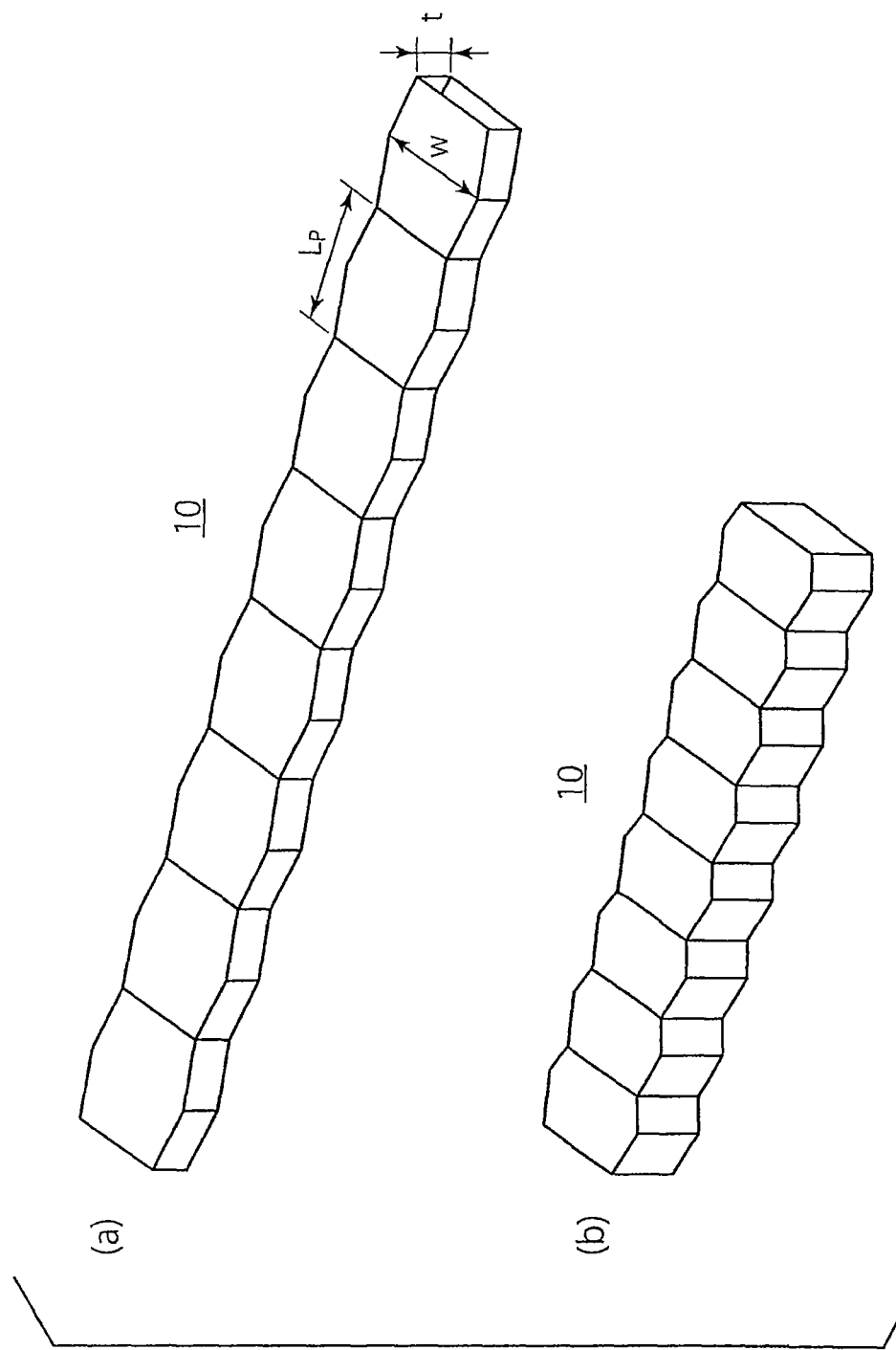
FIGS. 19($a$) and 19($b$) are diagrams for explaining the shape of the magnetic nanowire.

In a case where the length of the magnetic nanowire 10 is longer than 1 μm in the first direction, the magnitude of transient current that flows in the magnetic nanowire 10 immediately after current pulse introduction varies with location in the magnetic nanowire 10. As a result, there are cases where the domain wall shift distance varies with location in the magnetic nanowire 10. In that case, the mean value of the distances $L_2$ in a first region relatively close to the electrode 20 or the electrode 22 is made greater than the mean value of the distances $L_p$ in a second region located farther away from the electrode than the first region. With this arrangement, the differences in the domain wall shift distance can be effectively adjusted. As shown in FIG. 19(*a*), the magnetic nanowire 10 may be designed so that the width direction (the second direction) of the magnetic nanowire 10 varies while the surface in the thickness direction (the third direction) is flat. As shown in FIG. 19(*b*), the magnetic nanowire 10 may also be designed to have a greater thickness than that of the example illustrated in FIG. 19(*a*).

Figure 20:
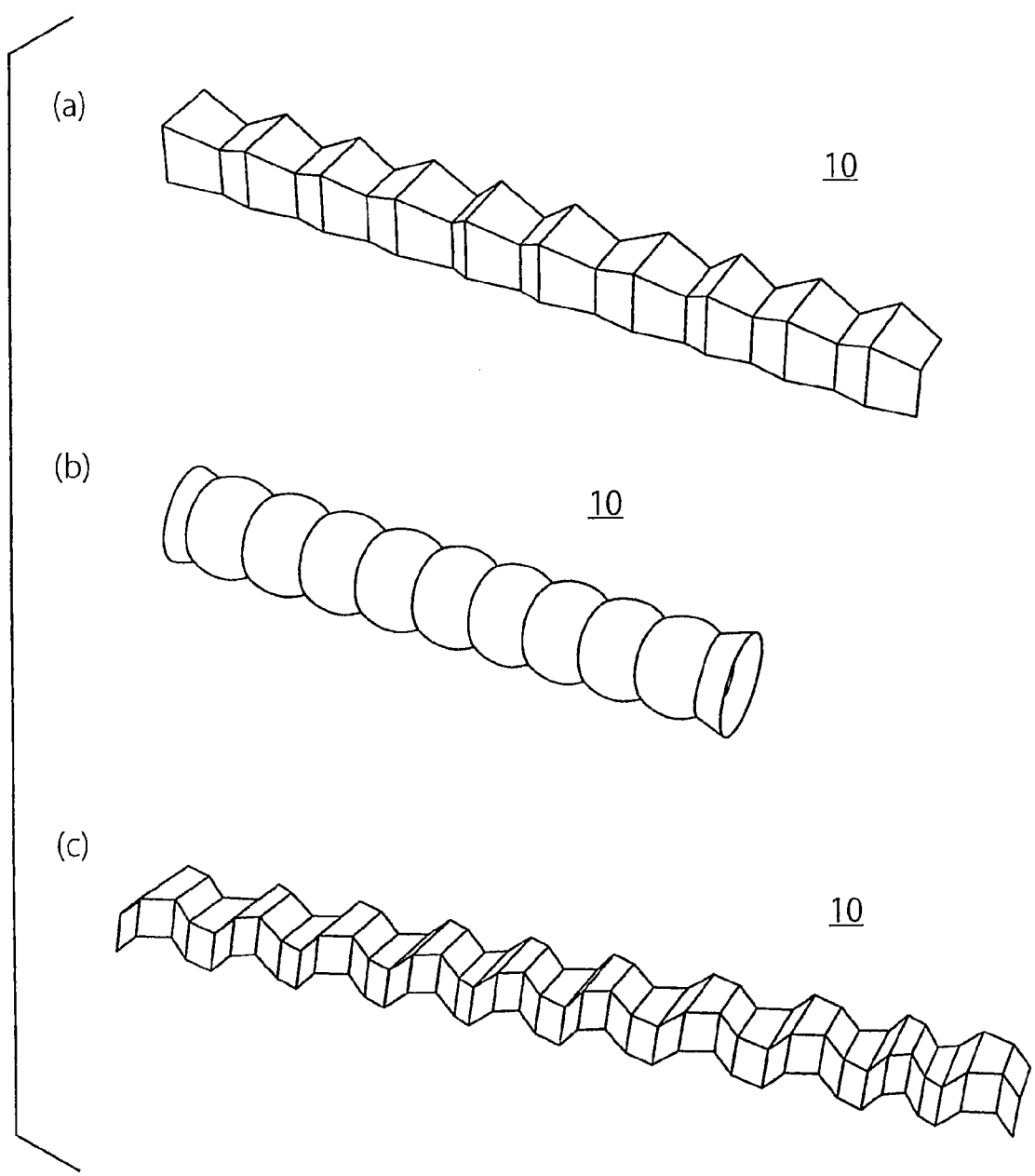
FIGS. 20($a$) through 20($c$) are diagrams for explaining the shape of the magnetic nanowire.

As shown in FIGS. 20(*a*) through 20(*c*), the magnetic nanowire 10 may have a shape in which both the second direction and the third direction vary in the first direction.

Figure 21:
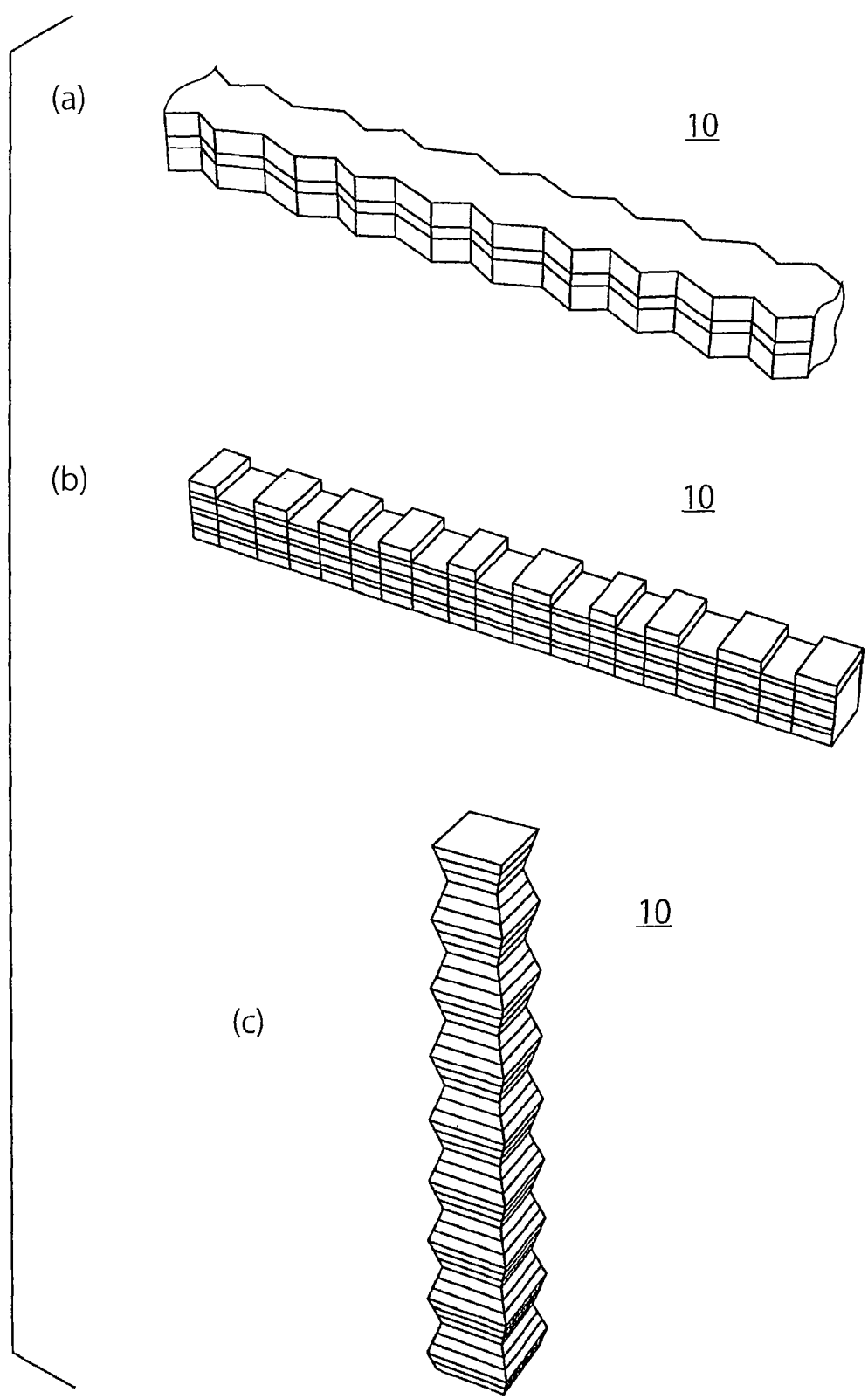
FIGS. 21($a$) through 21($c$) are diagrams for explaining the shape of the magnetic nanowire.

As shown in FIGS. 21(*a*) through 21(*c*), the magnetic nanowire 10 may have a stack structure in which the magnetic material forming the magnetic nanowire 10 is formed with sublayers. In cases where the magnetic nanowire 10 has a stack structure, the stack structure may include a nonmagnetic sublayer made of a nonmagnetic material. As the nonmagnetic sublayer, Cu, Au, Ag, Ru, Ir, Os, or an alloy containing at least one of these elements can be used. Where the stack structure includes a nonmagnetic sublayer, ferromagnetic coupling is caused between the two magnetic sublayers sandwiching the nonmagnetic sublayer in some cases, and antiferromagnetic coupling is caused in other cases. The sign and magnitude of coupling between magnetic sublayers vary with the material forming the nonmagnetic sublayer and the film thickness of the nonmagnetic sublayer. Particularly, a stack structure including an antiferromagnetic coupling portion is called an artificial antiferromagnetic structure. To achieve coupling between ferromagnetic sublayers, the film thickness of the nonmagnetic sublayer is preferably in the range of 0.5 nm to 10 nm. In a case where the magnetic nanowire 10 has a stack structure or where the magnetic nanowire 10 contains a ferrimagnetic material such as an alloy of a rare earth and a transition metal, the effective exchange interaction is small, and the domain wall width becomes smaller, accordingly. The total sum of the anisotropy energies over the domain wall width accounts for a considerable portion of the potential energy of the domain walls. Therefore, in a material having a small domain wall width, the domain walls are shifted in quick response to spatial modulation of the nanowire width in the magnetic storage element 1 of this embodiment. Such a material is preferable, because the effects of this embodiment are efficiently achieved. Also, in a case where the magnetic nanowire 10 contains a ferrimagnetic material or has an artificial antiferromagnetic structure, the substantial magnetization in the magnetic nanowire 10 becomes smaller, and accordingly, the spin-transfer torque efficiency becomes higher. Thus, the current value necessary for shifting the domain walls and magnetic domains can be made advantageously smaller.

As described so far, the first embodiment can provide magnetic storage elements in which the domain walls in a magnetic material can be displaced in a stable manner.

(Second Embodiment)

Figure 22:
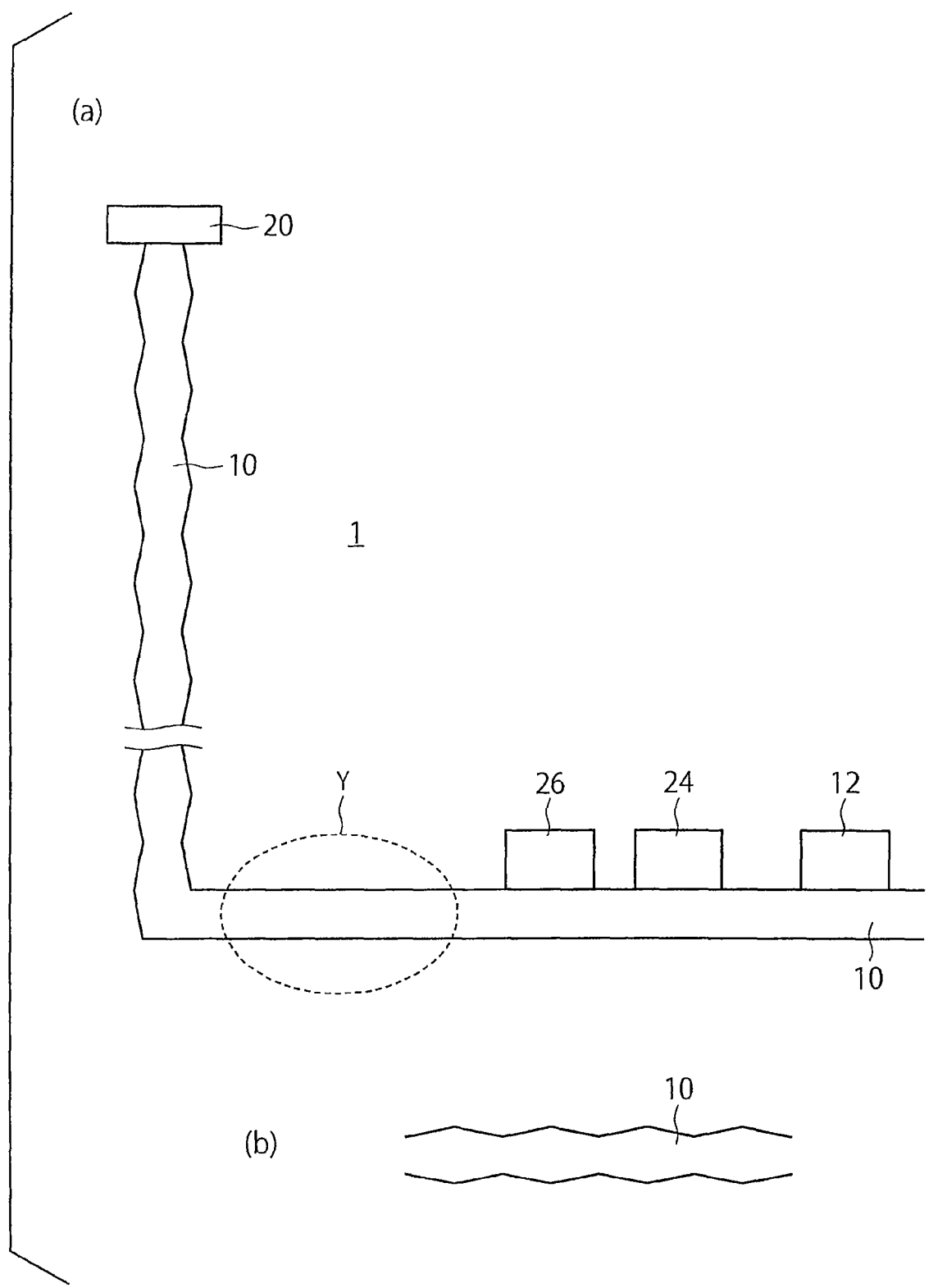
FIGS. 22($a$) and 22($b$) are diagrams showing a magnetic storage element according to a second embodiment.

FIGS. 22(*a*) and 22(*b*) show a magnetic storage element 1 according to a second embodiment. FIG. 22(*a*) is a cross-sectional view of the magnetic storage element 1 of the second embodiment, taken along a plane perpendicular to the substrate of the magnetic storage element 1. FIG. 22(*b*) is a top view of the portion Y indicated by a dashed line in FIG. 22(*a*).

In the magnetic storage element 1 of the second embodiment, a first direction extending over the entire area of a magnetic nanowire 10 is not a straight line, and there is a point at which the first direction is bent. For example, there is a portion at which the first direction is perpendicular to the substrate surface, and there is a portion at which the first direction is parallel to the substrate surface. The portion at which the first direction is perpendicular to the substrate surface is shown in a cross-sectional view taken along a line parallel to the width direction in FIG. 22(*a*). The portion at which the first direction is parallel to the substrate surface is shown in a cross-sectional view taken along a line parallel to the thickness direction in FIG. 22(*a*). FIG. 22(*b*) shows the surface parallel to the width direction at the portion at which the first direction is parallel to the substrate surface.

The shape of the magnetic nanowire 10 in the magnetic storage element 1 of the second embodiment is the same as the shape described in the first embodiment.

Like the first embodiment, the second embodiment can also provide magnetic storage elements in which the domain walls in a magnetic material can be shifted in a stable manner.

(Third Embodiment)

Figure 23:
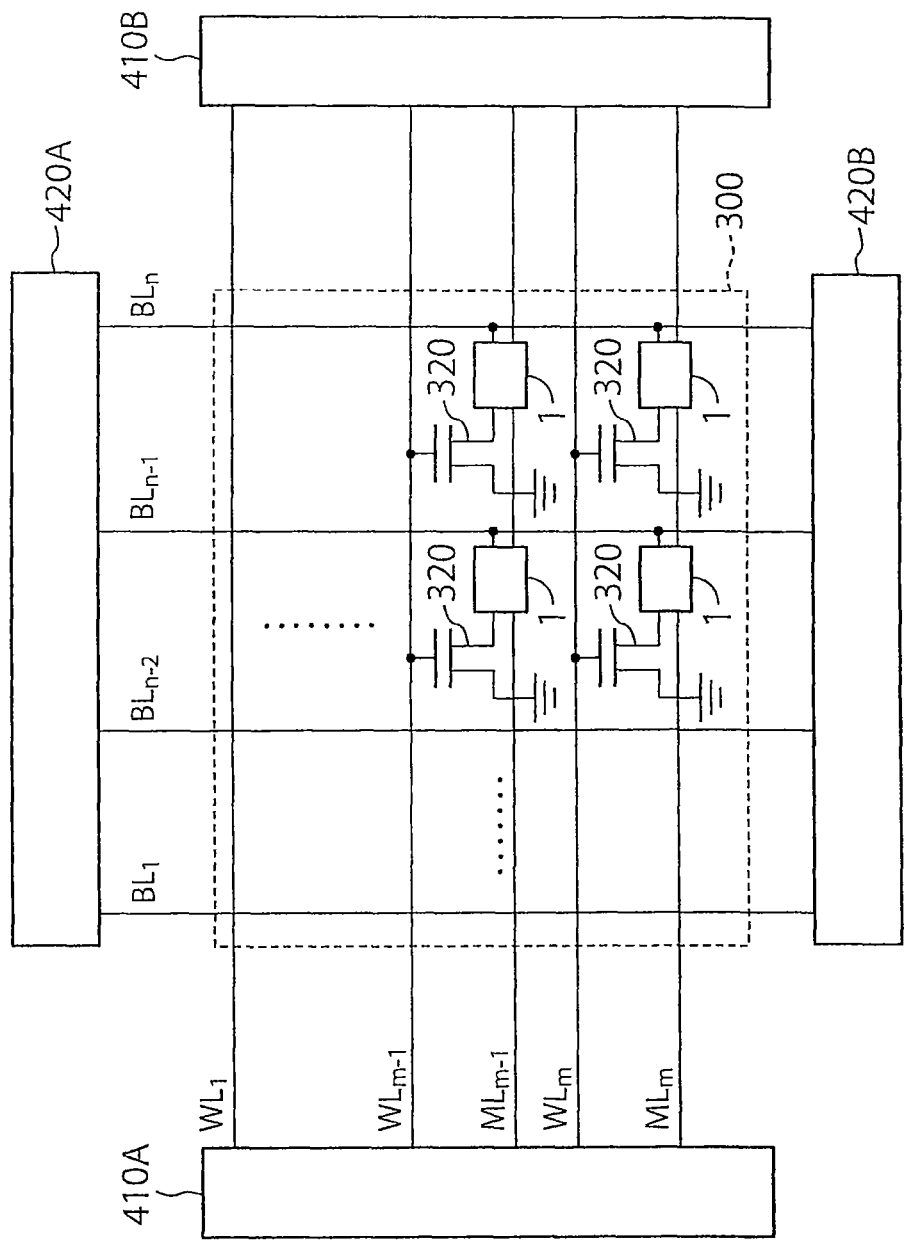
FIG. 23 is a circuit diagram of a magnetic storage device according to a third embodiment.
Figure 24:
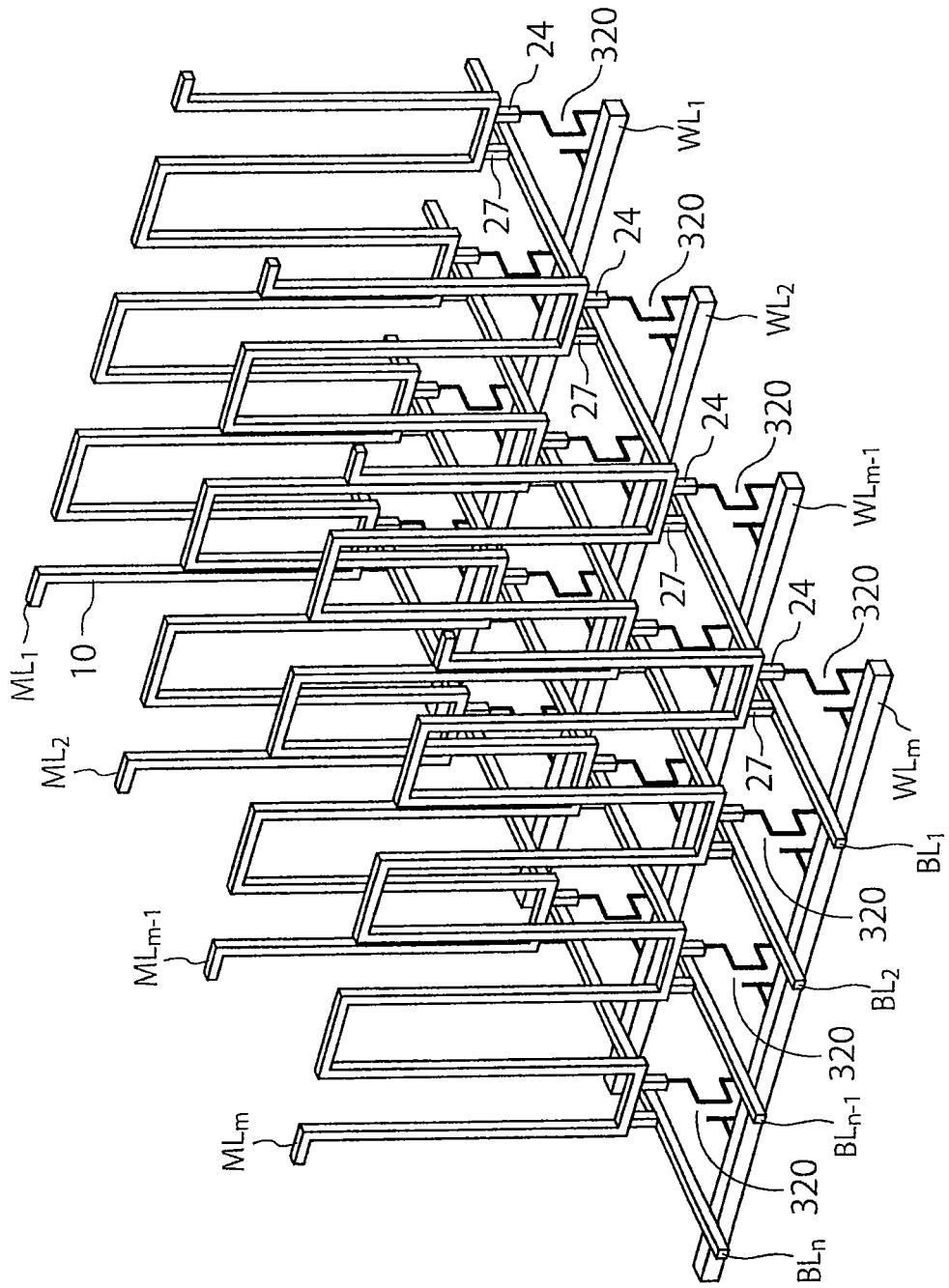
FIG. 24 is a perspective view of the memory cell array of the magnetic storage device according to the third embodiment.

Referring now to FIGS. 23 and 24, a magnetic storage device according to a third embodiment is described. FIG. 23 is a circuit diagram of the magnetic storage device of the third embodiment. FIG. 24 is a perspective view of the magnetic storage device.

The magnetic storage device 500 of the third embodiment includes a memory cell array 300. This memory cell array 300 includes memory cells that are arranged in a matrix form, and each of the memory cells includes a magnetic storage element 1 of the first or second embodiment and a switching element 320 formed with a transistor, for example. In the memory cell array 300, word lines $WL_1$ through $WL_m$ are provided in the respective rows, and bit lines $BL_1$ through $BL_n$ for information reading are provided in the respective columns.

The magnetic storage elements 1 of the n memory cells in the i-th ($1 \leq i \leq m$) row have magnetic nanowires 10 connected to form a magnetic nanowire $ML_i$. The magnetic nanowires 10 of the respective magnetic storage elements 1 may not be connected. The switching element 320 of each of the memory cells has its gate connected to the word line $WL_i$ ($1 \leq i \leq m$) of the corresponding row, has one end connected to one end of the reading unit 24 of the magnetic storage element 1 in the same memory cell, and has the other end grounded. The other end of the reading unit 24 of the magnetic storage element 1 in each of the memory cells is connected to the bit line $BL_j$ ($1 \leq j \leq n$) corresponding to the memory cell.

In a case where the magnetic nanowires 10 of magnetic storage elements 1 are connected as described above, the electrodes (the electrodes 20 and 22 described in the first embodiment) for applying current to the magnetic nanowires 10 may not be provided in the respective magnetic storage elements 1. The electrode 20 may be provided at one end of the magnetic nanowire $ML_i$, and the electrode 22 may be provided at the other end of the magnetic nanowire $ML_i$.

The word lines $WL_1$ through $WL_m$ and the magnetic nanowires $ML_1$ through $ML_m$ are connected to drive circuits 410A and 410B that select each nanowire and include a decoder, a write circuit, and the like. The bit lines $BL_1$ through $BL_n$ are connected to drive circuits 420A and 420B that select each nanowire and include a decoder, a read circuit, and the like. In FIGS. 23 and 24, the writing units of the magnetic storage elements 1 are not shown. Each of the writing units has one end connected to a switching element (not shown) for write selection, and has the other end connected to a current source (not shown). Each switching element for writing may also serve as a switching element for reading. Also, one reading unit and one writing unit may be provided for more than one memory cell. In that case, the degree of integration can be made higher. In a case where each memory cell includes one reading unit 24 and one writing unit 26 as shown in FIGS. 23 and 24, the data transfer rate can be made higher.

Next, domain wall shift in the memory cell array 300 according to this embodiment is described. In a first procedure, an address signal that is input from outside is decoded by the decoder in the drive circuits 410A, 410B, 420A, and 420B, the magnetic nanowire ML corresponding to the decoded address is selected, and current is applied to the selected magnetic nanowire ML. In a second procedure, the current is cut off, and a predetermined period of standby time follows. Domain wall shift (or shift movement of data) is performed by carrying out the first procedure and the second procedure.

By the above method of shifting domain walls in the memory cell array 300, the data storing positions also move in the magnetic storage elements 1 that belong to the same row of the memory cell array 300 and are connected by the magnetic nanowire $ML_i$. Where each magnetic storage element 1 shares a first magnetic layer located at an end with the other magnetic storage elements 1, and the magnetic storage elements 1 are connected, data can be collectively moved with a single current source. Accordingly, the power consumption by the entire memory cell array 300 can be reduced. The direction in which the domain walls are shifted is the same as the direction in which electrons flow, or is the opposite of the direction in which the current flows.

To perform writing on a memory cell, an address signal that is input from outside is first decoded by the decoder in the drive circuits 410A, 410B, 420A, and 420B, the word line WL corresponding to the decoded address is selected, and the corresponding switching element 320 is turned on. Current is then applied to the bit line BL, to perform writing. Alternatively, the data stored in the corresponding magnetic nanowire ML is moved by a necessary distance, and writing is then performed.

To read data from a memory cell, an address signal that is input from outside is first decoded by the decoder in the drive circuits 410A, 410B, 420A, and 420B, the magnetic nanowire ML corresponding to the decoded address is selected, and shift movement of data is caused by the above described method so that the bits to be read from the bit string stored as a magnetization direction in the memory cell are moved to the position of the reading unit. After that, the corresponding word line WL is selected, the switching element 320 is turned on, and current is applied to the bit line BL, to perform reading. The read current may have either a positive or negative orientation, but should have a smaller absolute value than the absolute value of the write current, so as to prevent inversions of stored data due to the reading.

The third embodiment can provide magnetic storage devices that can displace the domain walls in a magnetic material in a stable manner, using magnetic storage elements of the first or second embodiment.

(Fourth Embodiment)

Figure 25:
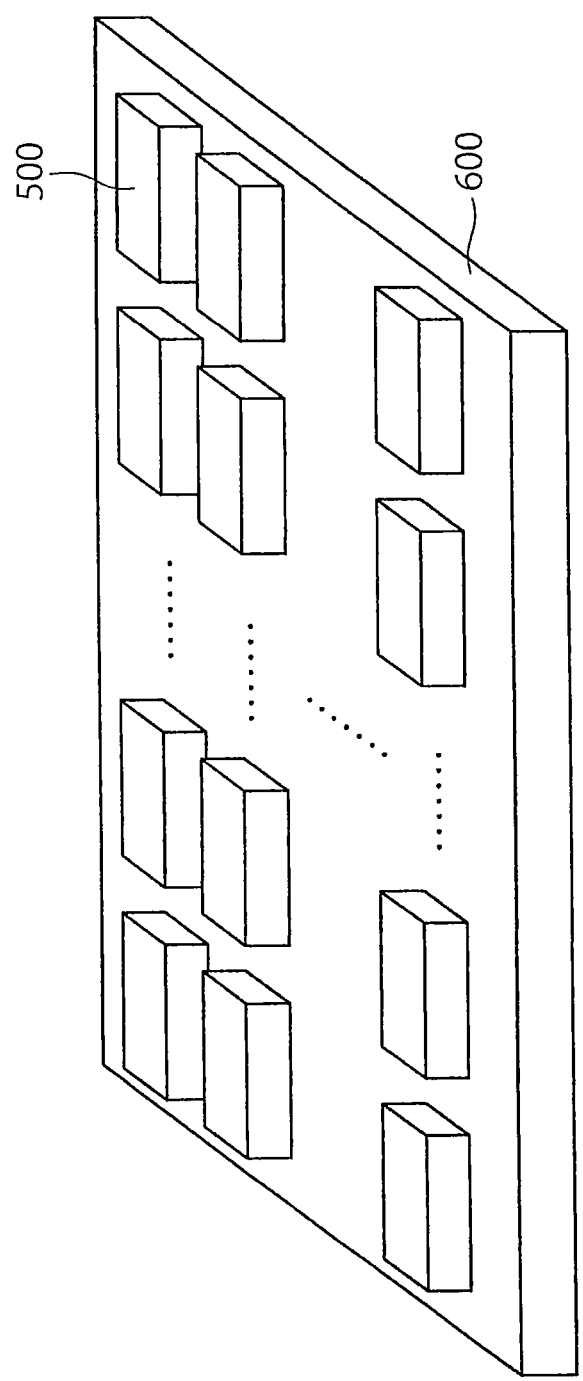
FIG. 25 is a perspective view of a magnetic memory according to a fourth embodiment.

FIG. 25 shows a magnetic memory according to a fourth embodiment. The magnetic memory of the fourth embodiment has a structure in which magnetic storage devices 500 of the third embodiment are arranged in a matrix farm on a substrate 600. With this structure, a large-capacity magnetic memory can be realized.

The fourth embodiment can provide a magnetic memory that can shift the domain walls in a magnetic material in a stable manner, using magnetic storage elements of the first or second embodiment.

Throughout this specification, "perpendicular" does not mean "strictly perpendicular", and some errors due to variations in the manufacturing process are allowed. Likewise, throughout this specification, "parallel" and "horizontal" do not mean "strictly parallel" and "strictly horizontal".

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic storage element comprising:
   a magnetic nanowire including a magnetic domain and a domain wall;
   a pair of electrodes configured to apply current to the magnetic nanowire for shifting the domain wall, the pair of electrodes being connected to the magnetic nanowire, the current flowing in a first direction in which the magnetic nanowire extends;
   a writing unit configured to write magnetization information into the magnetic domain, the writing unit being connected to the magnetic nanowire; and
   a reading unit configured to read the magnetization information from the magnetic domain, the reading unit being connected to the magnetic nanowire,
   wherein
   the magnetic nanowire has a magnetization direction perpendicular to the first direction in which the magnetic nanowire extends,
   a cross-section of the magnetic nanowire taken along a plane determined by the first direction and a second direction perpendicular to the first direction has first and second visible outlines,
   the first visible outline has a first minimal point at which a distance from a virtual straight line parallel to the first direction becomes minimal, a second minimal point at which the distance from the virtual straight line becomes minimal, and a first maximal point at which the distance from the virtual straight line becomes longest between the first minimal point and the second minimal point, the second minimal point being different from the first minimal point, the virtual straight line being located inside the magnetic nanowire, and
   an angle between a first straight line connecting the first minimal point and the second minimal point, and one of a second straight line connecting the first minimal point and the first maximal point and a third straight line connecting the second minimal point and the first maximal point is not smaller than four degrees and not larger than 30 degrees.

2. The element according to claim 1, wherein
   the second visible outline has a third minimal point at which the distance from the virtual straight line becomes minimal, a fourth minimal point at which the distance from the virtual straight line becomes minimal, and a second maximal point at which the distance from the virtual straight line becomes longest between the third minimal point and the fourth minimal point, the fourth minimal point being different from the third minimal point, and
   an angle between a fourth straight line connecting the third minimal point and the fourth minimal point, and one of a fifth straight line connecting the third minimal point and the second maximal point and a sixth straight line connecting the fourth minimal point and the second maximal point is not smaller than four degrees and not larger than 30 degrees.

3. The element according to claim 1, wherein a length of the magnetic nanowire is 60 nm or less in the second direction.

4. The element according to claim 1, wherein
   the second visible outline has a second maximal point at which the distance from the virtual straight line becomes longest, the second maximal point corresponding to the first maximal point of the first visible outline, a line connecting the first maximal point and the second maximal point of the second visible outline being substantially perpendicular to the first direction, and
   the first and second visible outlines each have a portion located on or outside a circumference of a circle having a diameter that is the line connecting the first maximal point and the second maximal point of the second visible outline.

5. The element according to claim 1, wherein the magnetic domain in the magnetic nanowire has a length of 6 to 200 nm in the first direction.

6. The element according to claim 1, wherein the magnetic nanowire is made of an alloy of a rare-earth element and an iron-group transition element.

7. The element according to claim 1, wherein
the first visible outline has a plurality of minimal points at which the distance from the virtual straight line becomes minimal,
the second visible outline has a plurality of minimal points at which the distance from the virtual straight line becomes minimal, the plurality of minimal points corresponding to the respective minimal points of the first visible outline, the plurality of minimal points being located in corresponding positions in the first direction, and
a distance between adjacent ones of the minimal points of the first visible outline varies with position in the first direction.

8. The element according to claim 1, wherein the magnetic nanowire has a portion with a nanowire width change rate of 10% or higher in a region having a length of 6 nm in the first direction.

9. The element according to claim 1, wherein the magnetic nanowire has a nanowire width change of 10 nm or less in a region having a length of 6 nm in the first direction.

10. A magnetic storage device comprising:
a plurality of magnetic storage elements according to claim 1, the magnetic storage elements being arranged in a matrix form;
a plurality of switching transistors corresponding to the plurality of magnetic storage elements, each of the switching transistors having a source or a drain connected to one end of the reading unit of each corresponding one of the magnetic storage elements in each corresponding column;
a plurality of first interconnects corresponding to rows, gates of the switching transistors in each corresponding row being connected to each of the first interconnects; and
a plurality of second interconnects corresponding to columns, the other end of the reading unit in each of the magnetic storage elements in each corresponding column being connected to each of the second interconnects.

11. A magnetic memory comprising
a plurality of magnetic storage devices according to claim 10, the magnetic storage devices being arranged in a matrix form.

12. A method of driving the magnetic storage element according to claim 1, the method comprising:
applying current to the magnetic nanowire through the pair of electrodes for a first period of time; and
cutting off the current after the applying the current, and standing by for a second period of time, the second period of time being longer than the first period of time.

13. A magnetic storage element comprising:
a magnetic nanowire including a magnetic domain and a domain wall;
a pair of electrodes configured to apply current to the magnetic nanowire for shifting the domain wall, the pair of electrodes being connected to the magnetic nanowire, the current flowing in a first direction in which the magnetic nanowire extends;
a writing unit configured to write magnetization information into the magnetic domain, the writing unit being connected to the magnetic nanowire; and
a reading unit configured to read the magnetization information from the magnetic domain, the reading unit being connected to the magnetic nanowire,
wherein
the magnetic nanowire has a magnetization direction perpendicular to the first direction in which the magnetic nanowire extends,
a cross-section of the magnetic nanowire taken along a plane determined by the first direction and a second direction perpendicular to the first direction has first and second visible outlines,
the first visible outline has a first maximal point at which a distance from a virtual straight line parallel to the first direction becomes maximal, a second maximal point at which the distance from the virtual straight line becomes maximal, and a first minimal point at which the distance from the virtual straight line becomes shortest between the first maximal point and the second maximal point, the second maximal point being different from the first maximal point, the virtual straight line being located inside the magnetic nanowire, and
an angle between a first straight line connecting the first maximal point and the second maximal point, and one of a second straight line connecting the first maximal point and the first minimal point and a third straight line connecting the second maximal point and the first minimal point is not smaller than four degrees and not larger than 30 degrees.

14. The element according to claim 13, wherein
the second visible outline has a third maximal point at which the distance from the virtual straight line becomes maximal, a fourth maximal point at which the distance from the virtual straight line becomes maximal, and a second minimal point at which the distance from the virtual straight line becomes shortest between the third maximal point and the fourth maximal point, the fourth maximal point being different from the third maximal point, and
an angle between a fourth straight line connecting the third maximal point and the fourth maximal point, and one of a fifth straight line connecting the third maximal point and the second minimal point and a sixth straight line connecting the fourth maximal point and the second minimal point is not smaller than four degrees and not larger than 30 degrees.

15. The element according to claim 13, wherein a length of the magnetic nanowire is 60 nm or less in the second direction.

16. The element according to claim 13, wherein
the second visible outline has a second maximal point at which the distance from the virtual straight line becomes longest, the second maximal point corresponding to the first maximal point of the first visible outline, a line connecting the first maximal point and the second maximal point of the second visible outline being substantially perpendicular to the first direction, and
the first and second visible outlines each have a portion located on or outside a circumference of a circle having a diameter that is the line connecting the first maximal point and the second maximal point of the second visible outline.

17. The element according to claim 13, wherein the magnetic domain in the magnetic nanowire has a length of 6 to 200 nm in the first direction.

18. The element according to claim 13, wherein the magnetic nanowire is made of an alloy of a rare-earth element and an iron-group transition element.

19. The element according to claim 13, wherein
the first visible outline has a plurality of minimal points at which the distance from the virtual straight line becomes minimal,
the second visible outline has a plurality of minimal points at which the distance from the virtual straight line becomes minimal, the plurality of minimal points corresponding to the respective minimal points of the first visible outline, the plurality of minimal points being located in corresponding positions in the first direction, and
a distance between adjacent ones of the minimal points of the first visible outline varies with position in the first direction.

20. The element according to claim 13, wherein the magnetic nanowire has a portion with a nanowire width change rate of 10% or higher in a region having a length of 6 nm in the first direction.

21. The element according to claim 13, wherein the magnetic nanowire has a nanowire width change of 10 nm or less in a region having a length of 6 nm in the first direction.

22. A magnetic storage device comprising:
a plurality of magnetic storage elements according to claim 13, the magnetic storage elements being arranged in a matrix form;
a plurality of switching transistors corresponding to the plurality of magnetic storage elements, each of the switching transistors having a source or a drain connected to one end of the reading unit of each corresponding one of the magnetic storage elements in each corresponding column;
a plurality of first interconnects corresponding to rows, gates of the switching transistors in each corresponding row being connected to each of the first interconnects; and
a plurality of second interconnects corresponding to columns, the other end of the reading unit in each of the magnetic storage elements in each corresponding column being connected to each of the second interconnects.

23. A magnetic memory comprising
a plurality of magnetic storage devices according to claim 22, the magnetic storage devices being arranged in a matrix form.

* * * * *